(12) United States Patent
Won et al.

(10) Patent No.: US 9,299,884 B2
(45) Date of Patent: Mar. 29, 2016

(54) LIGHT EMITTING DEVICE AND LIGHT EMITTING DEVICE PACKAGE INCLUDING THE SAME

(75) Inventors: Jong Hak Won, Seoul Square (KR); Jeong Sik Lee, Seoul Square (KR)

(73) Assignee: LG Innotek Co., Ltd., Seoul (KR)

( * ) Notice: Subject to any disclaimer, the term of this patent is extended or adjusted under 35 U.S.C. 154(b) by 194 days.

(21) Appl. No.: 13/547,810

(22) Filed: Jul. 12, 2012

(65) Prior Publication Data
US 2012/0286239 A1 Nov. 15, 2012

Related U.S. Application Data

(63) Continuation of application No. 12/958,592, filed on Dec. 2, 2010, now abandoned.

(30) Foreign Application Priority Data

Dec. 7, 2009 (KR) .................. 10-2009-0120380
Feb. 1, 2010 (KR) .................. 10-2010-0008981

(51) Int. Cl.
*H01L 29/06* (2006.01)
*H01L 31/00* (2006.01)
*H01L 33/06* (2010.01)
*H01L 33/02* (2010.01)
*H01L 33/04* (2010.01)
*H01L 33/32* (2010.01)

(52) U.S. Cl.
CPC .............. *H01L 33/06* (2013.01); *H01L 33/025* (2013.01); *H01L 33/04* (2013.01); *H01L 33/325* (2013.01); *H01L 2224/48091* (2013.01)

(58) Field of Classification Search
CPC ........ H01L 33/025; H01L 33/06; H01L 33/04
USPC .......... 257/13, 94, E33.043, E33.008, E33.01
See application file for complete search history.

(56) References Cited

U.S. PATENT DOCUMENTS

| 5,392,306 | A | 2/1995 | Usami et al. |
| 5,851,905 | A | 12/1998 | Mcintosh et al. |
| 6,147,363 | A | 11/2000 | Udagawa |
| 8,080,818 | B2 * | 12/2011 | Tanaka ........................... 257/13 |
| 2002/0053676 | A1 | 5/2002 | Kozaki |
| 2002/0139984 | A1 | 10/2002 | Sugawara et al. |
| 2003/0214989 | A1 | 11/2003 | Takase |
| 2004/0056258 | A1 | 3/2004 | Tadatomo et al. |
| 2005/0067613 | A1 | 3/2005 | Kim |
| 2006/0049415 | A1 | 3/2006 | Liao et al. |
| 2007/0051962 | A1 | 3/2007 | Lai |

(Continued)

FOREIGN PATENT DOCUMENTS

| CN | 1790756 A | 6/2006 |
| CN | 101582478 A | 11/2009 |

(Continued)

*Primary Examiner* — Robert Huber
(74) *Attorney, Agent, or Firm* — Dentons US LLP

(57) ABSTRACT

Provided are a light emitting device and a light emitting device package including the same. The light emitting device comprises a first conductive type semiconductor layer, an active layer comprising a plurality of quantum well layers and a plurality of barrier layers, which are alternately laminated on the first conductive type semiconductor layer, and a second conductive type semiconductor layer on the active layer. The plurality of barrier layers comprise a plurality of first barrier layers comprising an n-type dopant, and the conductive type dopant doped into the plurality of first barrier layers have different doping concentrations for each layer.

15 Claims, 17 Drawing Sheets

(56) References Cited

U.S. PATENT DOCUMENTS

| | | |
|---|---|---|
| 2008/0230794 A1 | 9/2008 | Yasuda et al. |
| 2009/0283746 A1 | 11/2009 | Chua et al. |
| 2010/0290497 A1 | 11/2010 | Freund |
| 2011/0042643 A1 | 2/2011 | Stauss et al. |

FOREIGN PATENT DOCUMENTS

| | | |
|---|---|---|
| KR | 100574738 B1 | 3/2002 |
| KR | 20-0372781 | 1/2005 |
| KR | 10-0476567 | 3/2005 |
| KR | 100649749 B1 | 11/2006 |
| KR | 100809215 B1 | 2/2008 |
| KR | 10-2008-0095432 A | 10/2008 |
| KR | 2008 0095452 A | 10/2008 |
| KR | 100905877 B1 | 5/2009 |
| KR | 2009 0062501 A | 6/2009 |
| KR | 2009 0096911 A | 9/2009 |
| TW | 200924245 A | 6/2009 |
| WO | 2009085050 A1 | 7/2009 |

\* cited by examiner

LIGHT EMITTING DEVICE AND LIGHT EMITTING DEVICE PACKAGE INCLUDING THE SAME

CROSS-REFERENCE TO RELATED APPLICATIONS

This application is a Continuation of U.S. patent application Ser. No. 12/958,592 filed on Dec. 2, 2010, now abandoned which claims priority under 35 U.S.C. §119(a) of Korean Patent Application Nos. 10-2009-0120380 (filed on Dec. 7, 2009) and 10-2010-0008981 (filed on Feb. 1, 2010), which are hereby incorporated by reference in its entirety.

BACKGROUND

Embodiments relate a light emitting device and a light emitting device package including the same.

Light emitting diodes (LEDs) are semiconductor light emitting-devices that convert current into light. As luminance of LEDs is increased recently, the LEDs are being used as light sources for displays, vehicles, and illuminations. Also, LEDs emitting highly efficient white light may be realized by using a fluorescent substance or combining LEDs having various colors.

To improve bright and performance of LEDs, various methods such as a method of improving a light extraction structure, a method of improving a structure of an active layer, a method of improving current spreading, a method of improving an electrode structure, and a method of improving a structure of a light emitting diode package may be being attempted.

SUMMARY

Embodiments provide a light emitting device having improved brightness, a light emitting device package, and a lighting unit.

Embodiments provide a light emitting device having improved light emitting efficiency, a light emitting device package, and a lighting unit.

Embodiments also provide a light emitting device having improved reliability, a light emitting device package, and a lighting unit.

In one embodiment, a light emitting device comprises: a first conductive type semiconductor layer; an active layer including a plurality of quantum well layers and a plurality of barrier layers alternately laminated on the first conductive type semiconductor layer; and a second conductive type semiconductor layer on the active layer, wherein the plurality of barrier layers comprise a plurality of first barrier layers in which a conductive type dopant is doped and the conductive type dopant doped into the plurality of first barrier layers has different doping concentrations for each layer, wherein the plurality of barrier layers comprise at least one second barrier layer in which an n-type dopant and a p-type dopant are not doped, wherein the at least one second barrier layer is disposed adjacent to the second conductive type semiconductor layer, wherein the plurality of first barrier layers are disposed adjacent to the first conductive type semiconductor layer, and wherein the plurality of first barrier layers have a doping concentration of a relatively high concentration of the conductive type dopant as the first barrier layer becomes close to the at least one second barrier layer.

In another embodiment, a light emitting device comprises: a first conductive type semiconductor layer; an active layer including plurality of quantum well layers and plurality of barrier layers alternately laminated on the first conductive type semiconductor layer; and a second conductive type semiconductor layer on the active layer, wherein the plurality of barrier layers comprise plurality of first barrier layers doped with an n-type dopant and at least one second barrier layer which is not doped with an n-type dopant and a p-type dopant, wherein the active layer comprises an region in which the plurality of first barrier layers and the at least one second barrier layer are alternately laminated, and wherein the plurality of first barrier layers are disposed to be closer to the first conductive type semiconductor layer than to the second conductive type semiconductor layer, and the at least one second barrier layer is disposed to be closer to the second conductive type semiconductor layer than to the first conductive type semiconductor layer, wherein the first conductive type semiconductor layer includes an n-type semiconductor layer.

In further another embodiment, a light emitting device package comprises: a body; first and second lead electrodes on the body; and a light emitting device on the body, the light emitting device being electrically connected to the first and second lead electrodes, wherein the light emitting device comprises: a first conductive type semiconductor layer; an active layer comprising a plurality of quantum well layers and a plurality of barrier layers, which are alternately laminated on the first conductive type semiconductor layer; and a second conductive type semiconductor layer on the active layer, wherein the plurality of barrier layers comprise a plurality of first barrier layers comprising an n-type dopant, and the n-type dopant doped into the plurality of first barrier layers has different doping concentrations for each layer.

The details of one or more embodiments are set forth in the accompanying drawings and the description below. Other features will be apparent from the description and drawings, and from the claims.

DETAILED DESCRIPTION OF THE EMBODIMENTS

Figure 1:
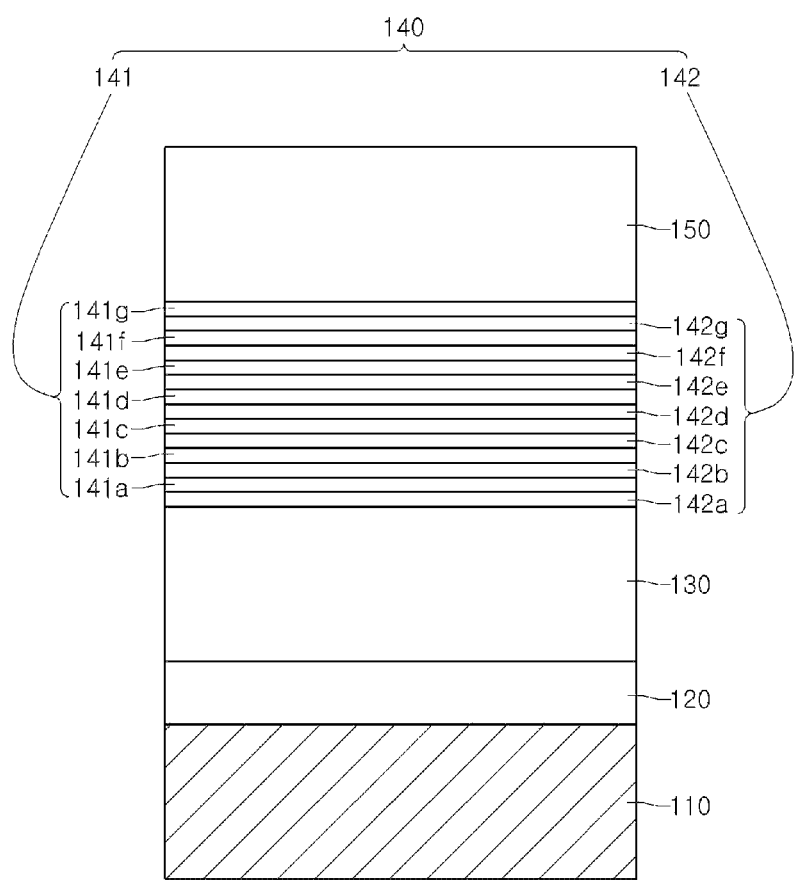
FIG. 1 is a sectional view of a light emitting device according to a first embodiment.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Further, the reference about 'on' and 'under' each layer will be made on the basis of drawings.

Example embodiments will now be described more fully hereinafter with reference to the accompanying drawings. In the drawings, the thickness or size of each layer is exaggerated, omitted, or schematically illustrated for convenience in description and clarity. Also, the size of each element does not entirely reflect an actual size.

<First Embodiment>

FIG. 1 is a sectional view of a light emitting device according to a first embodiment.

Referring to FIG. 1, a light emitting device 100A may include a substrate 110, an undoped semiconductor layer 120 on the substrate 110, a first conductive type semiconductor layer 130 on the undoped semiconductor layer 120, an active layer 140 including a plurality of quantum well layers 142 and a plurality of barrier layers 141, which are alternately laminated on the first conductive type semiconductor layer 130, and a second conductive type semiconductor layer 150 on the active layer 140.

The substrate 110 may include at least one of sapphire ($Al_2O_3$), SiC, Si, GaAs, GaN, ZnO, GaP, InP, Ge, and a metal, but is not limited thereto.

The substrate 110 may have an uneven top surface having a predetermined shape and cycle or a top surface inclined at a predetermined angle to improve light extraction efficiency and effectively grow the semiconductor layer.

The undoped semiconductor layer 120, the first conductive type semiconductor layer 130, the active layer 140, and the second conductive type semiconductor layer 150 are sequentially stacked on the substrate 110.

For example, the layers may be formed using a metal organic chemical vapor deposition (MOCVD) process, a chemical vapor deposition (CVD) process, a plasma-enhanced chemical vapor deposition (PECVD) process, a molecular beam epitaxy (MBE) process, or a hydride vapor phase epitaxy (HVPE) process, but is not limited thereto.

The undoped semiconductor layer 120 may be disposed on the substrate 110. The undoped semiconductor layer 120 is a layer in which a conductive type dopant is not doped to have an electrical conductivity significantly less than those of the first and second conductive type semiconductor layers 130 and 150. For example, the undoped semiconductor layer 120 may be formed of a semiconductor material having a compositional formula of $In_xAl_yGa_{1-x-y}N$ ($0 \le x \le 1$, $0 \le y \le 1$, $0 \le x+y \le 1$), e.g., InAlGaN, GaN, AlGaN, InGaN, AN, InN, or AlInN, but is not limited thereto.

A buffer layer (not shown) for reducing a lattice constant difference between the undoped semiconductor layer 120 and the substrate 110 may be further disposed between the undoped semiconductor layer and the substrate 110. The lattice constant of the buffer layer (not shown) may have an intermediate value of the lattice constant of the substrate 110 and the lattice constant of the undoped semiconductor layer 120. Also, the buffer layer (not shown) may be formed of a semiconductor material having a compositional formula of $In_xAl_yGa_{1-x-y}N$ ($0 \le x \le 1$, $0 \le y \le 1$, $0 \le x+y \le 1$), e.g., InAlGaN, GaN, AlGaN, InGaN, AlN, InN, or AlInN, but is not limited thereto. Also, the buffer layer may be formed of a group II-VI compound semiconductor, but is not limited thereto.

The buffer layer (not shown) and the undoped semiconductor layer 120 may not be provided at all, or at least one of the buffer layer and the undoped semiconductor layer 120 may be provided, but is not limited thereto.

The first conductive type semiconductor layer 130 may be disposed on the undoped semiconductor layer 120. For example, the first conductive type semiconductor layer 130 may include an N-type semiconductor layer. The N-type semiconductor layer may be formed of a semiconductor material having a compositional formula of $In_xAl_yGa_{1-x-y}N$ ($0 \le x \le 1$, $0 \le y \le 1$, $0 \le x+y \le 1$), e.g., InAlGaN, GaN, AlGaN, InGaN, AlN, InN, or AlInN. Alternatively, the first conductive type semiconductor layer 130 may be doped with an N-type dopant such as Si, Ge, Sn, or C.

The active layer 140 may be disposed on the first conductive type semiconductor layer 130.

The active layer 140 is a layer in which electrons (or holes) injected through the first conductive type semiconductor layer 130 are coupled to holes (or electrons) injected through the second conductive type semiconductor layer 150 to emit light by a band gap difference of an energy band depending on a formation material of the active layer 140.

For example, the active layer 140 may be formed of a semiconductor material having a compositional formula of $In_xAl_yGa_{1-x-y}N$ ($0 \le x \le 1$, $0 \le y \le 1$, $0 \le x+y \le 1$).

Also, the active layer 140 may have at least one of a single quantum well structure, a multi quantum well (MQW) structure, a quantum dot structure, and a quantum wire structure. However, the present embodiment will be described with respect to the MQW structure in which the active layer 140 including the plurality of quantum well layers 142 and the plurality of barrier layers 141 is alternately laminated.

The plurality of barrier layers 141 may include first barrier layers 141a, 141b, 141c, and 141d in which a conductive type dopant is doped and at least one second barrier layer 141e, 141f, or 141g in which the conductive type dopant is not doped.

Although carriers (electrons and holes) are provided in the first and second conductive type semiconductor layers 130 and 150, the conductive type dopant may be doped into the first barrier layers 141a, 141b, 141c, and 141d to additionally secure the carriers, thereby improving internal quantum efficiency of the active layer 140.

The conductive type dopant may be an N-type or a P-type dopant. For example, the N-type dopant may include at least one of Si, Ge, Sn, and C, and the P-type dopant may include at least one of Mg, Zn, Ca, Sr, and Ba.

The at least one second barrier layer (141e, 141f, or 141g) may be disposed more close to the second conductive type semiconductor layer 150 than the first conductive type semiconductor layer 130. As a result, it may prevent light from being largely generated in quantum well layers 142f and 142g adjacent to the second conductive type semiconductor layer 150. Thus, it may be possible to improve reliability and light emitting quality of the light emitting device according to the embodiment.

When the P-type dopant having a relative large particle size is permeated into the quantum well layers 142f and 142g adjacent to the second conductive type semiconductor layer 150, the light emitting quality may be deteriorated. Also, when light is largely generated in a specific region of the active layer 140, the corresponding region may be deteriorated. The at least one second barrier layer 141e, 141f, or 141g may not be formed, but is not limited thereto.

The at least one second barrier layer 141e, 141f, or 141g may be disposed adjacent to any one of the first conductive type semiconductor layer 130 and the second conductive type semiconductor layer 150, and the plurality of first barrier layers 141a, 141b, 141c, and 141d may be disposed adjacent to the other one of the first conductive type semiconductor layer 130 and the second conductive type semiconductor layer 150.

Here, when the plurality of first barrier layers 141a, 141b, 141c, and 141d is disposed adjacent to the first conductive type semiconductor layer 130 including the N-type dopant, the conductive type dopant doped into the plurality of first barrier layers 141a, 141b, 141c, and 141d may be the N-type dopant. When the plurality of first barrier layers 141a, 141b, 141c, and 141d is disposed adjacent to the second conductive type semiconductor layer 150 including the P-type dopant, the conductive type dopant doped into the plurality of first barrier layers 141a, 141b, 141c, and 141d may be the P-type dopant.

For convenience of description, the at least one second barrier layer 141e, 141f, or 141d is a layer in which the dopant is not doped. Also, the second barrier layers 141e, 141f, or 141d include three layers and are disposed adjacent to the second conductive type semiconductor layer 150. The plurality of first barrier layers 141a, 141b, 141c, and 141d includes four layers and are disposed adjacent to the first conductive type semiconductor layer 130. Also, the N-type dopant is doped into the plurality of first barrier layers 141a, 141b, 141c, and 141d.

Also, the plurality of barrier layers 141 is called number 1 to 7 barrier layers in order from the barrier layer adjacent to the first conductive type semiconductor layer 130, and the plurality of quantum well layers 142 is called number 1 to 7 quantum well layers in order from the quantum well adjacent to the first conductive type semiconductor layer 130.

The plurality of first barrier layers 141a, 141b, 141c, and 141d may include the number 1 barrier layer 141a, the number 2 barrier layer 141b, the number 3 barrier layer 141c, and the number 4 barrier layer 141d, and the second barrier layers 141e, 141f, and 141g may include the number 5 barrier layer 141e, the number 6 barrier layer 141f, and the number 7 barrier layer 141g, but is not limited thereto. For example, the plurality of barrier layers 141 and the plurality of quantum well layers 142 may be repeatedly stacked two to thirty times.

A doping concentration of the N-type dopant may be higher at the first barrier layer 141a, 141b, 141c, or 141d adjacent to the second barrier layers 141e, 141f, and 141g.

That is, the doping concentration of the N-type dopant may be gradually increased in order from the first barrier layer 141a, 141b, 141c, or 141d away from the second barrier layers 141e, 141f, and 141g to the first barrier layer 141a, 141b, 141c, or 141d adjacent to the second barrier layers 141e, 141f, and 141g.

For example, the number 1 barrier layer 141a may have a doping concentration of about $7.5 \times 10^{17}$ cm$^{-3}$, and the number 2 barrier layer 141b may have a doping concentration of about $1.5 \times 10^{18}$ cm$^{-3}$. Also, the number 3 barrier layer 141c may have a doping concentration of about $3.0 \times 10^{18}$ cm$^{-3}$, and the number 4 barrier layer 141d may have a doping concentration of about $6.0 \times 10^{18}$ cm$^{-3}$. The doping concentration of the N-type dopant may be successively increased twice for each layer. However, the doping concentration of the N-type dopant may be increased over, e.g., at least one time for each layer. For example, the doping concentration may be increased one time to ten times or by a random ratio, but a regular ratio for each layer, but is not limited thereto.

As the doping concentrations of the plurality of first barrier layers 141a, 141b, 141c, or 141d are successively increased, the light emitting efficiency and brightness of the plurality of quantum well layers 142 may be improved. Also, as a number and position of the actual light emitting layers of the plurality of quantum well layers 142 are controlled, the reliability of the active layer 140 may be improved.

The second conductive type semiconductor layer 150 may be disposed on the active layer 140. For example, the second conductive type semiconductor layer 150 may be realized as a P-type semiconductor layer. The P-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., at least one of InAlGaN, GaN, AlGaN, InGaN, AN, InN, and AlInN. Also, Mg, Zn, Ca, Sr, Ba, or the like as a P-type dopant may be doped into the second conductive type semiconductor layer 150.

The first conductive type semiconductor layer 130 may include the P-type dopant, and the second conductor type semiconductor layer 150 may include an N-type dopant, but are not limited thereto. Also, a third semiconductor layer (not shown) including the N- or P-type dopant may be disposed on the second conductive type semiconductor layer 150. Thus, the light emitting device may have any one of an N-P junction structure, a P-N junction structure, a P-N-P junction structure, and an N-P-N junction structure.

A clad layer (not shown) in which the N- or P-type dopant is doped may be disposed on and/or under the active layer 140. The clad layer (not shown) may include a semiconductor layer having a band gap higher than that of the barrier layer and/or quantum well layer of the active layer 140, for example, an AlGaN layer or InAlGaN layer.

Hereinafter, an operation principle of the light emitting device according to the first embodiment will be described in detail.

Figure 2:
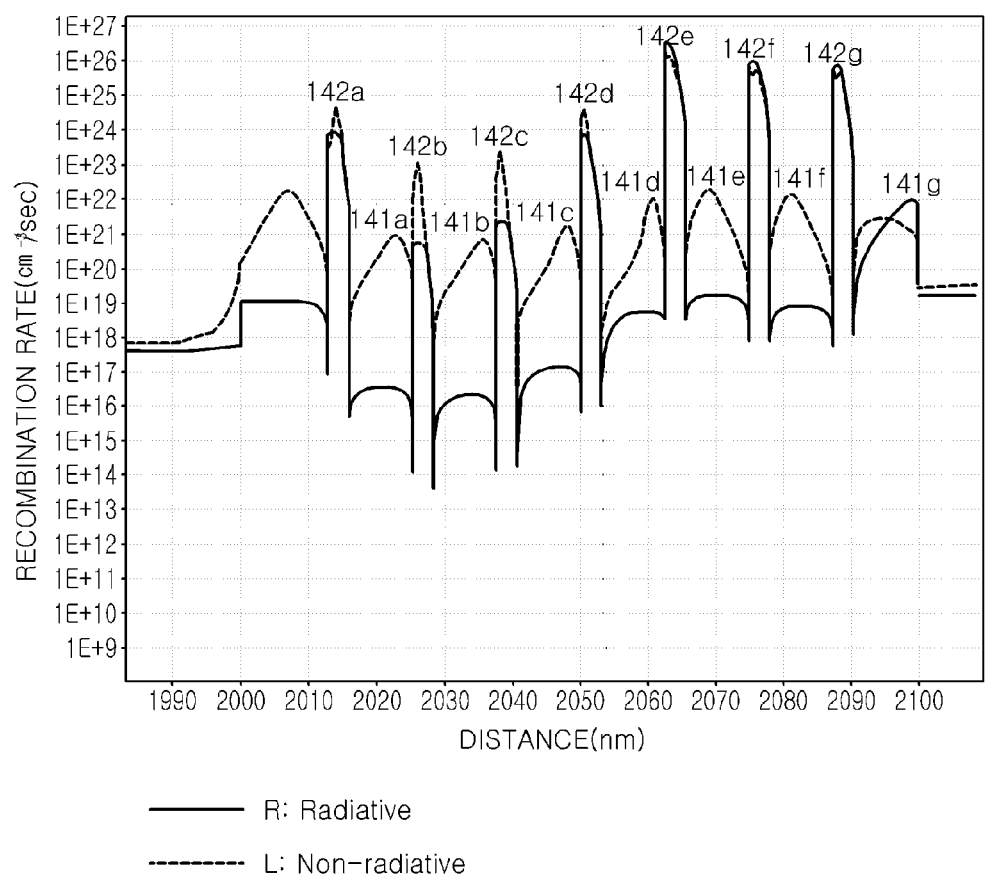
FIG. 2 is a view illustrating a carrier recombination rate in an active layer of the light emitting device according to the first embodiment.
Figure 3:
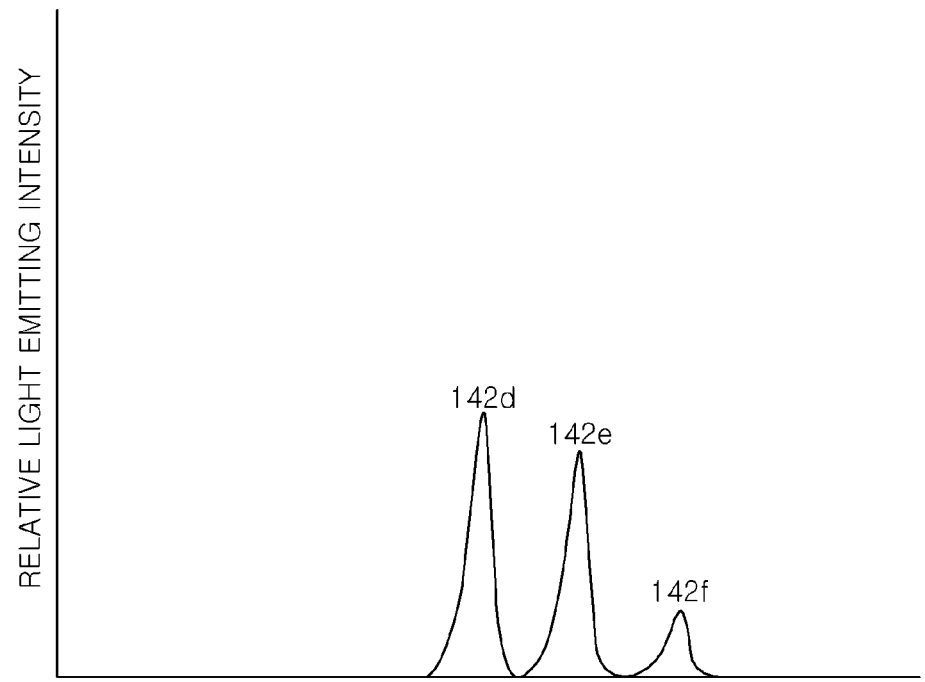
FIG. 3 is a view illustrating a relative light emitting intensity of a plurality of quantum well layers of the active layer of the light emitting device according to the first embodiment.

FIG. 2 is a view illustrating a carrier recombination rate in an active layer 140 of the light emitting device according to the first embodiment, and FIG. 3 is a view illustrating a relative light emitting intensity of a plurality of quantum well layers 142 of the active layer 140.

An X-axis of FIG. 2 represents a distance (nm), and a Y-axis represents a carrier recombination rate (cm$^{-3}$/sec).

Referring to FIG. 2, a region in which recombination probability of the carriers while the carriers radiate (R) light is greater than that of the carriers while the carriers non-radiate (N) light corresponds to the number 5 to 7 quantum well layers 142d, 142e, 142f adjacent to the second barrier layers 141e, 141f, and 141g.

Referring to FIG. 3, light is emitted in the number 5 to 7 quantum well layers 142d, 142e, and 142f. Here, it is seen that the light emitting intensity is relatively large at the quantum well layer adjacent to the first barrier layers 141a, 141b, 141c, or 141d.

Since the plurality of first barrier layers 141a, 141b, 141c, or 141d is successively increased in doping concentration of the N-type dopant as the first barrier layers 141a, 141b, 141c, or 141d become closer to the second barrier layers 141e, 141f, and 141g, the first barrier layer disposed more close to the second barrier layers 141e, 141f, and 141g may provide a more large amount of electrons to the quantum well layer 142.

Also, the second conductive type semiconductor layer 150 provides holes. Since the holes have low mobility, the second conductive type semiconductor layer 150 may provide a large amount of holes to the quantum well layer 142 adjacent to the second conductive type semiconductor layer 150.

Thus, the carrier recombination may smoothly occur in the number 5 to 7 quantum well layers 142e, 142f, and 142g disposed in the region in which the carrier, i.e., the electrons and the holes are smoothly provided at the same time to emit light. Also, the number 5 quantum well layer 142e of the number 5 to 7 quantum well layers 142e, 142f, and 142g has the greatest light emitting intensity because the number 5 quantum well layer 142e is adjacent to the first barrier layers 141a, 141b, 141c, and 141d to receive the large amount of electrons. Also, the number 6 quantum well layer 142f may have light emitting intensity greater than that of the number 7 quantum well layer 142g.

The holes may be provided by the P-type dopant such as Mg, Zn, Ca, Sr, and Ba contained in the second conductive type semiconductor layer 150. The P-type dopant may be permeated into the quantum well layer 142 adjacent to the second conductive type semiconductor layer 150 to interrupt crystallinity of the quantum well layer 142.

In the present embodiment, since the number 5 quantum well layer 142e has the light emitting intensity greater than those of the number 6 and 7 quantum well layers 142f and 142g most adjacent to the second conductive type semiconductor layer 150, a large amount of light may be generated in a layer in which a small amount of the P-type dopant is permeated and having good crystallinity. Thus, light emitting efficiency and brightness of the light emitting device may be improved, and also reliability of the active layer 140 may be improved.

<Second Embodiment>

Hereinafter, a light emitting device according to a second embodiment will be described in detail. In descriptions of the second embodiment, the same parts as those of the first embodiment will be referred to the first embodiment, and their duplicated descriptions will be omitted.

The light emitting device according to the second embodiment is similar to the light emitting device according to the first embodiment except that a doping concentration of a conductive type dopant contained in a plurality of first barrier layer is relatively low in a layer adjacent to the second barrier layer. Thus, a sectional view of the light emitting device according to the second embodiment is equal to that (FIG. 1) of the light emitting device according to the first embodiment.

Referring to FIG. 1, a light emitting device 100A may include a substrate 110, an undoped semiconductor layer 120 on the substrate 110, a first conductive type semiconductor layer 130 on the undoped semiconductor layer 120, an active layer 140 including a plurality of quantum well layers 142 and a plurality of barrier layers 141, which are alternately stacked on the first conductive type semiconductor layer 130, and a second conductive type semiconductor layer 150 on the active layer 140.

The active layer 140 may have a multi-quantum well (MQW) structure including a plurality of quantum well layers 142 and a plurality of barrier layers 141, which are alternately stacked.

The plurality of barrier layers 141 may include first barrier layers 141a, 141b, 141c, and 141d in which an N-type type dopant is doped and at least one second barrier layer 141e, 141f, or 141g in which the N-type dopant is not doped.

The at least one second barrier layer 141e, 141f, or 141g may be disposed adjacent to the second conductive type semiconductor layer 150, and the plurality of first barrier layers 141a, 141b, 141c, and 141d may be disposed adjacent to the first conductive type semiconductor layer 130.

A doping concentration of the N-type dopant may be relatively low in one layer of the plurality of first barrier layers 141a, 141b, 141c, and 141d adjacent to the at least one second barrier layer 141e, 141f, or 141g. That is, the plurality of first barrier layers 141a, 141b, 141c, and 141d may have doping concentrations gradually decreasing toward a layer adjacent to the second barrier layers 141e, 141f, and 141g.

For example, the number 1 barrier layer 141a may have a doping concentration of about $6.0 \times 10^{18}$ cm$^{-3}$, and the number 2 barrier layer 141b may have a doping concentration of about $3.0 \times 10^{18}$ cm$^{-3}$. Also, the number 3 barrier layer 141c may have a doping concentration of about $1.5 \times 10^{18}$ cm$^{-3}$, and the number 4 barrier layer 141d may have a doping concentration of about $7.5 \times 10^{17}$ cm$^{-3}$. The doping concentration of the N-type dopant may be successively decreased in about half for each layer. However, the doping concentration of the N-type dopant may be increased less than at least one time for each layer. For example, the doping concentration may be increased one time to about one-to-ten times or by a random ratio, but a regular ratio for each layer, but is not limited thereto.

Hereinafter, an operation principle of the light emitting device according to the second embodiment will be described in detail.

Figure 4:
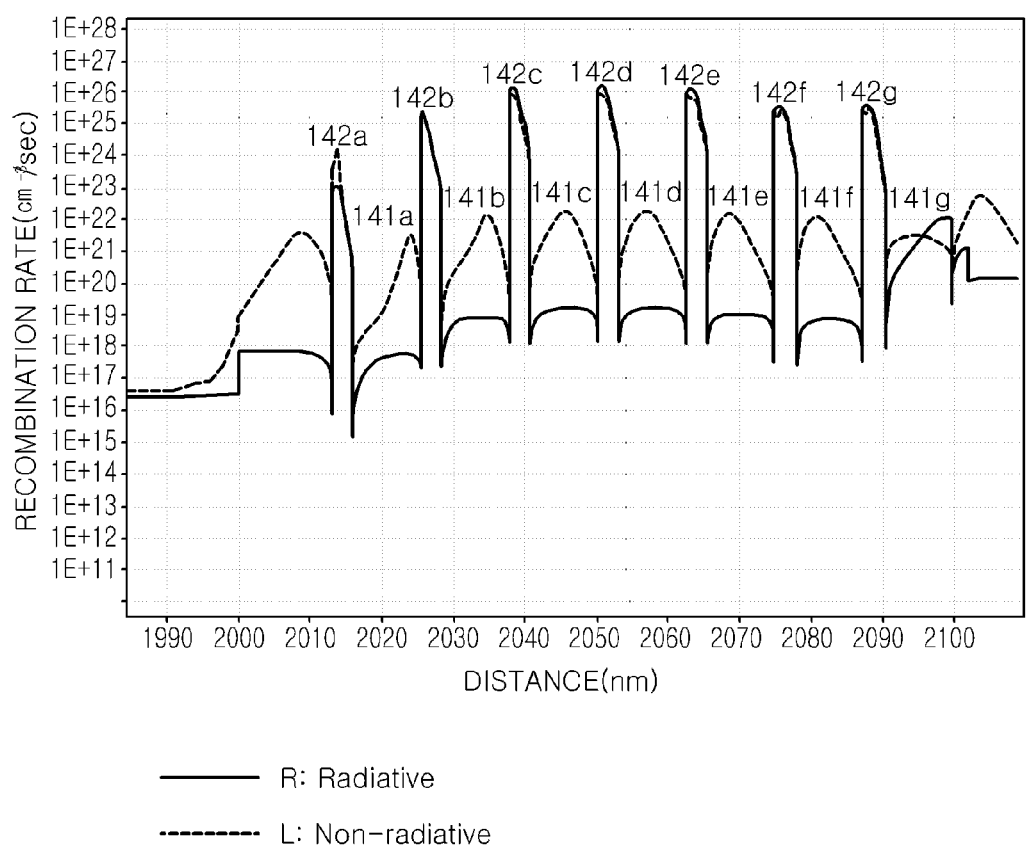
FIG. 4 is a view illustrating a carrier recombination rate in an active layer of a light emitting device according to a second embodiment.
Figure 5:
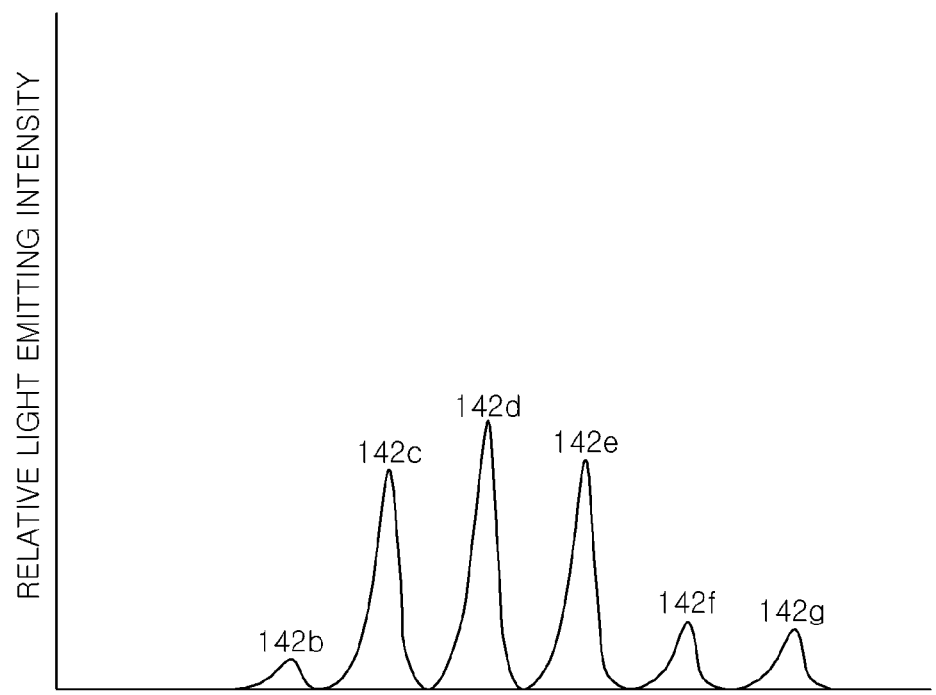
FIG. 5 is a view illustrating a relative light emitting intensity of a plurality of quantum well layers of the active layer of the light emitting device according to the second embodiment.

FIG. 4 is a view illustrating the carrier recombination rate in the active layer 140 of the light emitting device according to the second embodiment, and FIG. 5 is a view illustrating a relative light emitting intensity of the plurality of quantum well layers 142 of the active layer 140.

An X-axis of FIG. 4 represents a distance (nm), and a Y-axis represents a carrier recombination rate (cm$^{-3}$/sec).

Referring to FIG. 4, a region in which recombination probability of the carriers while the carriers radiate (R) light is greater than that of the carriers while the carriers non-radiate (N) light corresponds to the most region of the plurality of quantum well layers 142.

Referring to FIG. 5, light is emitted in the most region of the plurality of quantum well layers 142. In particular, it is seen that the light emitting intensity is relatively large at the number 3 to 5 quantum well layers 142c, 142d, and 142e disposed at a central portion of the active layer 140.

Since the plurality of first barrier layers 141a, 141b, 141c, or 141d is successively decreased in doping concentration of the N-type dopant as the first barrier layers 141a, 141b, 141c, or 141d become closer to the at least one second barrier layer 141e, 141f, or 141g, the quantum well layer 142 adjacent to the first conductive type semiconductor layer may receive a more large amount of electrons.

A region in which the carriers, i.e., the electrons and the holes are supplied to sufficiently emit light may correspond to the most region of the plurality of quantum well layers 142. In particular, the carrier recombination may smoothly occur in the number 3 to 5 quantum well layers 142c, 142d, and 142e to provide a high light emitting intensity.

The holes may be provided by the P-type dopant such as Mg, Zn, Ca, Sr, and Ba contained in the second conductive type semiconductor layer 150. The P-type dopant may be permeated into the quantum well layer 142 adjacent to the second conductive type semiconductor layer 150 to interrupt crystallinity of the quantum well layer 142.

In the present embodiment, since the number 3 to 5 quantum well layers 142c, 142d, and 142e have the light emitting intensity greater than those of the number 6 and 7 quantum well layers 142f and 142g most adjacent to the second conductive type semiconductor layer 150, a large amount of light may be generated in a layer in which a small amount of the P-type dopant is permeated and having good crystallinity. Thus, light emitting efficiency and brightness of the light emitting device may be improved, and also reliability of the active layer 140 may be improved.

Also, since light is generated in the most region of the active layer 140, the deterioration capable of occurring when light is generated only at a specific region and the defect occurrence rate may be reduced.

Also, since light is generated in the most region of the active layer 140, the light emitting efficiency may be stable with respect to a density variation of current applied to the light emitting device.

<Third Embodiment>

Hereinafter, a light emitting device according to a third embodiment will be described in detail. In descriptions of the third embodiment, the same parts as those of the first embodiment will be referred to the first embodiment, and their duplicated descriptions will be omitted.

The light emitting device according to the second embodiment is similar to the light emitting device according to the first embodiment except that a plurality of barrier layers and at least one second barrier layer are alternately stacked. Thus, a sectional view of the light emitting device according to the third embodiment is equal to that of the light emitting device according to the first embodiment.

FIG. 1 is a sectional view of a light emitting device according to a third embodiment.

Referring to FIG. 1, a light emitting device 100A may include a substrate 110, an undoped semiconductor layer 120 on the substrate 110, a first conductive type semiconductor layer 130 on the undoped semiconductor layer 120, an active layer 140 including a plurality of quantum well layers 142 and a plurality of barrier layers 141, which are alternately stacked on the first conductive type semiconductor layer 130, and a second conductive type semiconductor layer 150 on the active layer 140.

The active layer 140 may have a multi-quantum well (MQW) structure including a plurality of quantum well layers 142 and a plurality of barrier layers 141, which are alternately stacked.

The plurality of barrier layers 141 may include first barrier layers 141a, 141c, 141e, and 141g in which an N-type type dopant is doped and at least one second barrier layer 141b, 141d, or 141f in which the N-type dopant is not doped.

The plurality of first barrier layers 141a, 141c, 141e, and 141g and the at least one second barrier layer 141b, 141d, or 141f may be alternately stacked.

Doping concentrations of the N-type dopant contained in the plurality of first barrier layers 141a, 141c, 141e, and 141g may be different from each other. For example, the doping concentrations of the plurality of first barrier layers 141a, 141c, 141e, and 141g may be successively increased or described, but is not limited thereto.

Hereinafter, an operation principle of the light emitting device according to the third embodiment will be described in detail.

Figure 6:
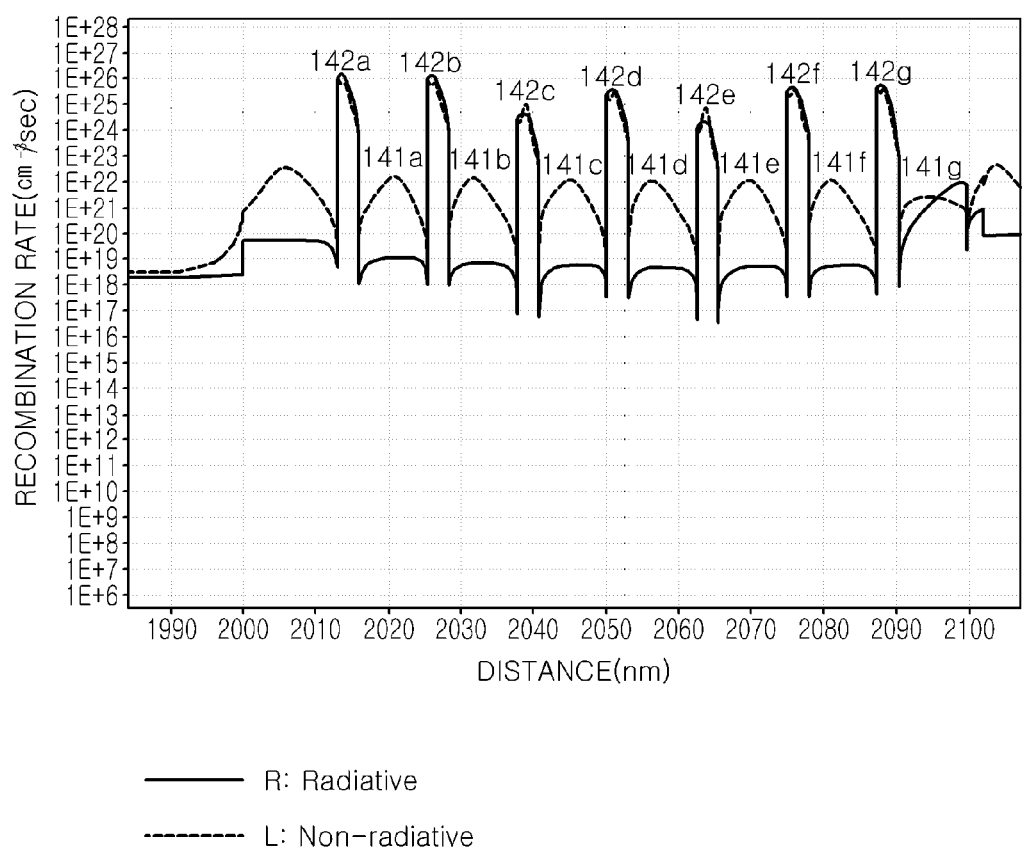
FIG. 6 is a view illustrating a carrier recombination rate in an active layer of a light emitting device according to a third embodiment.
Figure 7:
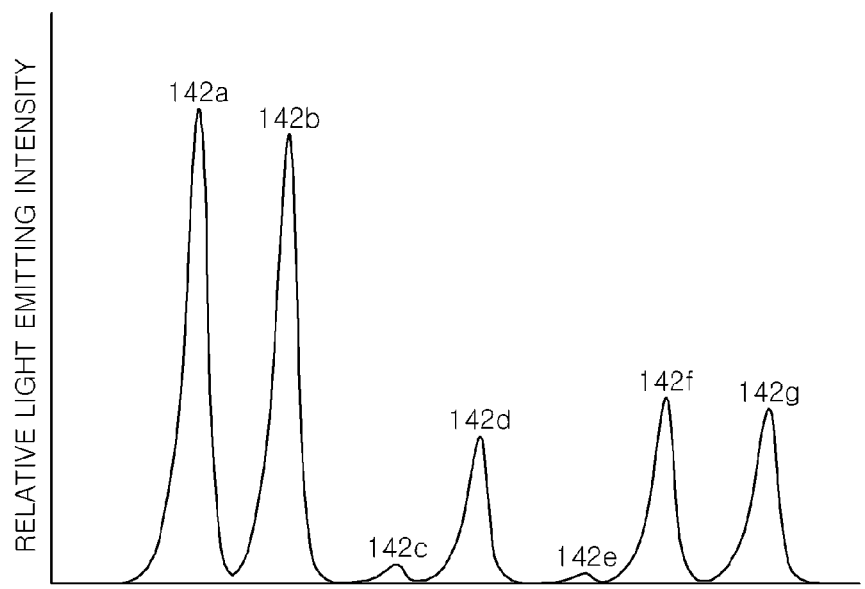
FIG. 7 is a view illustrating a relative light emitting intensity of a plurality of quantum well layers of the active layer of the light emitting device according to the third embodiment.

FIG. 6 is a view illustrating the carrier recombination rate in the active layer 140 of the light emitting device according to the third embodiment, and FIG. 7 is a view illustrating a relative light emitting intensity of the plurality of quantum well layers 142 of the active layer 140.

An X-axis of FIG. 6 represents a distance (nm), and a Y-axis represents a carrier recombination rate ($cm^{-3}$/sec).

Referring to FIG. 6, a region in which recombination probability of the carriers while the carriers radiate (R) light is greater than that of the carriers while the carriers non-radiate (N) light corresponds to the most region of the plurality of quantum well layers 142.

Referring to FIG. 7, light is emitted in the most region of the plurality of quantum well layers 142. In particular, it is seen that the light emitting intensity is relatively large at number 1, 2, 6 and 7 quantum well layers 142c, 142d, and 142e disposed at both ends of the active layer 140.

The plurality of first barrier layers 141a, 141c, 141e, and 141g containing the N-type dopant and the at least one second barrier layers 141b, 141d, and 141f are alternately stacked, and electrons provided by the N-type dopant are moved from the first conductive type semiconductor layer 130 to the second conductive type semiconductor layer 150. Thus, a large amount of electrons may be provided in number 2, 4, and 6 quantum well layers 142b, 142d, and 142f.

Also, a number 1 quantum well layer 142a may smoothly receive the electrons from the first conductive type semiconductor layer 130, and a number 7 quantum well layer 142f may smoothly receive holes from the second conductive type semiconductor layer 150.

Thus, light is emitted in the most region of the plurality of quantum well layers 142. In particular, the light emitting intensity may be relatively large at the number 1, 2, 6, and 7 quantum well layers 142c, 142d, and 142e disposed at both ends of the active layer 140.

In the present embodiment, since light is generated in the most region of the active layer 140, the deterioration capable of occurring when light is generated only at a specific region and the defect occurrence rate may be reduced, thereby improving light emitting efficiency of the light emitting device.

According to the embodiment described above, although the conductive type dopant is doped into the plurality of first barrier layers 141a, 141c, 141e, and 141g, the present disclosure is not limited thereto. For example, the conductive type dopant may be doped into the plurality of quantum well layers 142 to adjust light emitting position and intensity.

Figure 8:
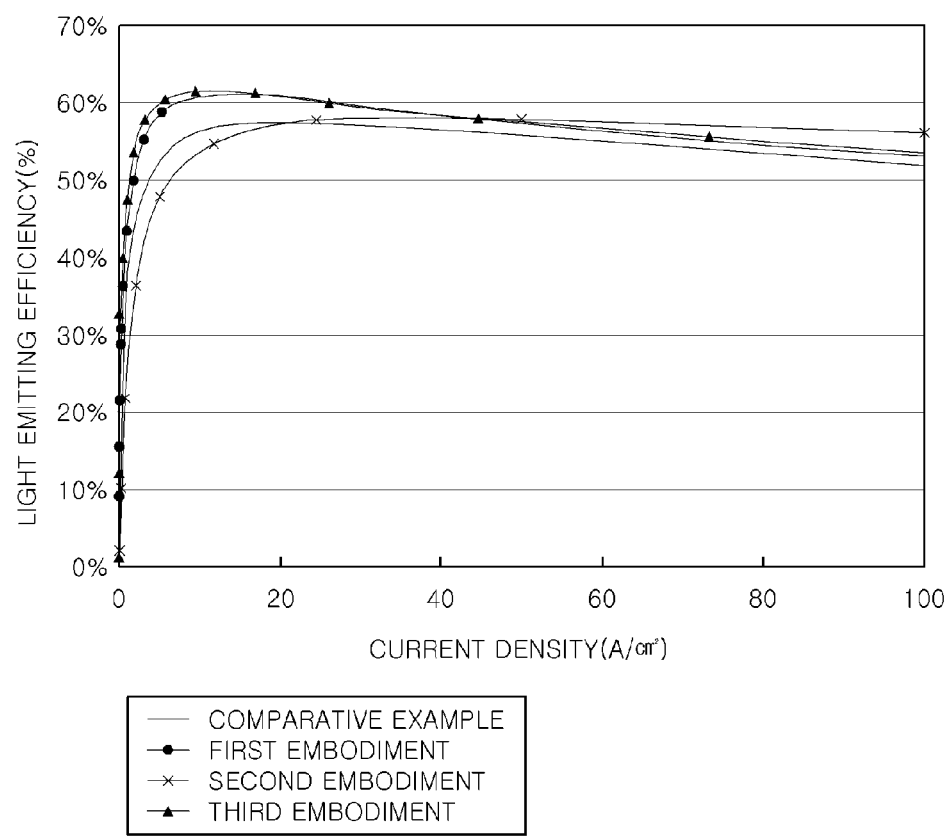
FIG. 8 is a graph illustrating light emitting efficiency of light emitting devices according to an embodiment and a comparative example.

FIG. 8 is a graph illustrating light emitting efficiency of light emitting devices according to an embodiment and a comparative example.

A light emitting device according to the comparative example is a light emitting device in which a doping concentration of a conductive type dopant contained in the plurality of first barrier layers is not changed.

An x-axis of FIG. 8 represents a current density ($A/cm^2$), and a Y-axis represents light emitting efficiency (%).

Referring to FIG. 8, it is seen that the light emitting devices according to the first and third embodiments have improved light emitting efficiency according to a current density when compared to the light emitting device according to the comparative example.

Also, the light emitting device according to the second embodiment has light emitting efficiency less than that of the light emitting device according to the comparative example.

However, since a variation of the light emitting efficiency according to the current density is low in the light emitting device according to the second embodiment, the light emitting device according to the second embodiment has relatively high light emitting efficiency in a high current density when compared to the light emitting device according to the comparative example. That is, it is seen that the light emitting device according to the second embodiment stably radiates light with respect to the variation of the current density.

<Fourth Embodiment>

Hereinafter, a light emitting device according to a fourth embodiment will be described in detail. In descriptions of the fourth embodiment, the same parts as those of the first embodiment will be referred to the first embodiment, and their duplicated descriptions will be omitted.

In a light emitting device according to a fourth embodiment, the active layer of the light emitting device according to the first to third embodiments is designed to generate light having two wavelength bands different from each other.

Figure 9:
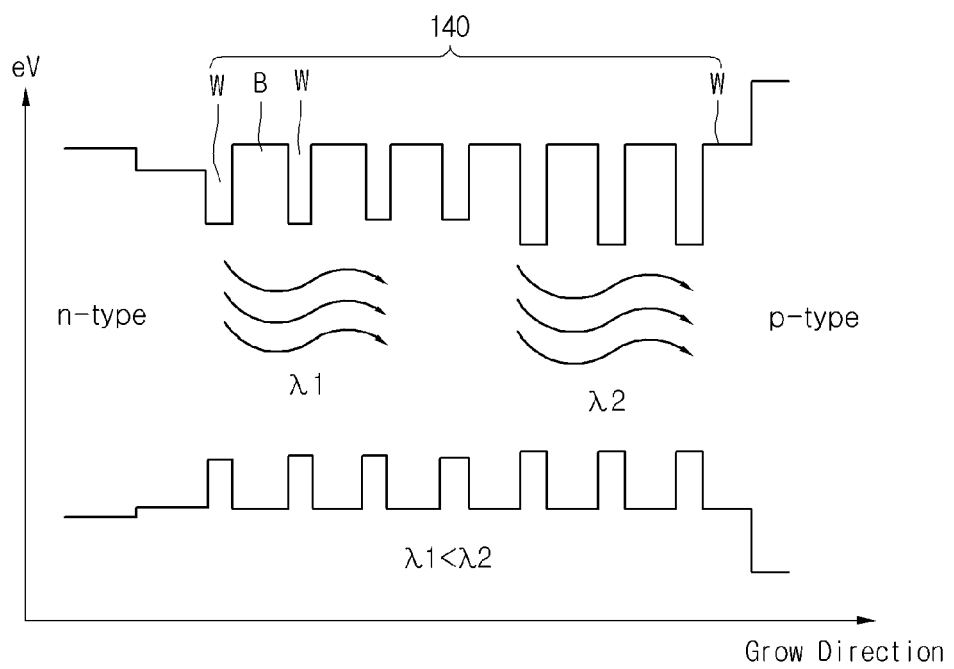
FIGS. 9 and 10 are graphs illustrating a band gap energy of an active layer of a light emitting device according to a fourth embodiment.
Figure 10:
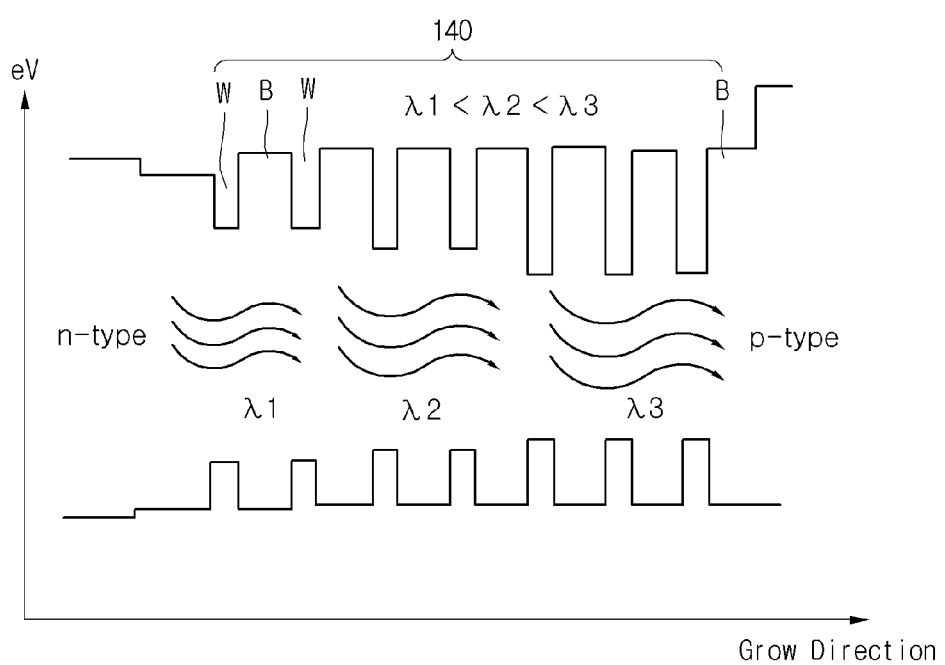

FIGS. 9 and 10 are graphs illustrating a band gap energy of an active layer of a light emitting device according to a fourth embodiment.

Referring to FIGS. 1, 9, and 10, a light emitting device according to a fourth embodiment may include a substrate 110, an undoped semiconductor layer 120 on the substrate 110, a first conductive type semiconductor layer 130 on the undoped semiconductor layer 120, and a plurality of quantum well layers 142 and barrier layers 141, which are alternately stacked on the first conductive type semiconductor layer 130. Also, the light emitting device may further include an active layer 140 generating light having at least two different wavelength bands and a second conductive type semiconductor layer 150 on the active layer.

Here, like the first and second embodiments, the plurality of barrier layers 141 may include a plurality of barrier layers 141a, 141b, 141c, and 141d in which a conductive type dopant is doped. The conductive type dopant doped into the plurality of first barrier layers 141a, 141b, 141c, and 141d may have different doping concentrations for each layer.

Alternatively, like the third embodiment, the plurality of barrier layers 141 may include first barrier layers 141a, 141b, 141c, and 141d in which a conductive type dopant is doped and at least one second barrier layer 141e, 141f, or 141g in which the conductive type dopant is not doped. Also, the plurality of barrier layers 141 may have a region in which the plurality of barrier layers 141a, 141b, 141c, and 141d and the at least one second barrier layer 141e, 141f, and 141g are alternately stacked.

The active layer 140 may generate light having at least two different wavelength bands to improve internal quantum efficiency of the active layer 140 using a phenomenon in which light energy having a short wavelength induces the emission of light having a long wavelength.

That is, the more a wavelength of light is short, the more energy is increased as shown in Equation 1. Thus, when the active layer 140 generates the light having the at least two different wavelength bands, long wavelength light having relative low energy may be induced by short wavelength light having relative high energy.

$$E = hc/\lambda \quad \text{(Equation 1)}$$

(where, E+energy of light, h=Planck constant, c=speed of light, and λ=wavelength of light)

Also, since the light having the at least two different wavelength bands is color-mixed to generate light having a new wavelength band, the light emitting device according to the embodiment may easily obtain light having a desired color.

According to a first method in which the active layer 140 generates the light having the at least two different wavelength bands, an amount of In contained in a plurality quantum well layers 142 of the active layer 140 is adjusted according to light emitting regions of the active layer 140.

When the active layer 140 is formed of a semiconductor material having a compositional formula of $In_xAl_yGa_{1-x-y}N$ ($0 \leq x \leq 1$, $0 \leq y \leq 1$, $0 x+y \leq 1$), the more an indium (In) content is increases, the more band gap energy of the active layer 140 may be decreased. Thus, this is done because light having a long wavelength is generated.

For example, when the active layer 140 emits light having a first wavelength band λ1 and light having a second wavelength band λ2 with a main wavelength longer than the first wavelength band λ1, the In content contained in a first light emitting region of the active layer 140 that emits the light having the first wavelength band λ1 may be less than that contained in a second light emitting region of the active layer 140 that emits the light having the second wavelength band λ2.

Also, energy of the light having the first wavelength band with a relative short wavelength than that having the second wavelength band induces the emission of the light having the second wavelength band, thereby improve the light emitting efficiency of the light emitting device according to the embodiment.

For example, when the main wavelength of the light having the second wavelength band is blue-based light having a wavelength of about 430 nm to about 470 nm, the In content contained in the second light emitting region may be about 10% to about 30%. The In content contained in the first light emitting region may be less than about 10%, but is not limited thereto.

According to a second method in which the active layer 140 generates light having the at least two different wavelength bands, the plurality of quantum well layers 142 or the plurality of barrier layers 141, which constitute the active layer 140 may have thicknesses different from each other.

This is done because the more a thickness of at least one of the plurality of quantum well layers 142 or the plurality of barrier layers 141 is thicker, the more a wavelength of emitted light is shorter.

For example, when the active layer 140 emits light having the first wavelength band and light having the second wavelength band with a main wavelength longer than the first wavelength band, the barrier layer 141 and the quantum well layer 142 in the first light emitting region of the active layer 140 that emits the light having the first wavelength band may have thicknesses less than those of the barrier layer 141 and the quantum well layer 142 in the second light emitting region of the active layer 140 that emits the light having the second wavelength band. However, the present disclosure is not limited to the methods in which the active layer 140 generates light having the at least two different wavelength bands, and the foregoing descriptions is just an example. Also, when one quantum well layer 142a and one barrier layer 141a are provided in one pair, a thickness of each of pairs 142a/141a, . . . , 142g/141g may be different from each other or a pair thickness for each region may be different from each other. Here, a number of any one of the barrier layer B and the quantum well layer W may be much or less, but is not limited thereto.

Also, as shown in FIG. 10, when the active layer 140 generate light having three or more wavelength bands (λ1<λ2<λ3), the active layer 140 may have a main wavelength increasing or decreasing toward one direction, but is not limited thereto.

As described above, the light emitting device according to the fourth embodiment may generate the light having at least two wavelength bands. Thus, the light emitting efficiency of the light emitting device may be improved. Also, like the first to third embodiments, a number and position of the actual light emitting layers of the plurality of quantum well layers 142 are controlled to vary the light generated from the actual light emitting layer, thereby providing the light emitting device having maximized light emitting efficiency.

The reference symbol W shown in the active layer 140 of FIGS. 9 and 10 represents an energy band gap of each quantum well layer, and the reference symbol B represents an energy band gap of each barrier layer. Also, a pair of the quantum well layer and the barrier layer that is the first light emitting region of the active layer 140 may be disposed in a region adjacent to the second conductive type semiconductor layer, and the pair of the quantum well layer and the barrier layer that is the second light emitting region may be disposed in a region more adjacent to the first conductive type semiconductor layer and vice versa.

<Light Emitting Device Having Lateral Type Electrode Structure>

Figure 11:
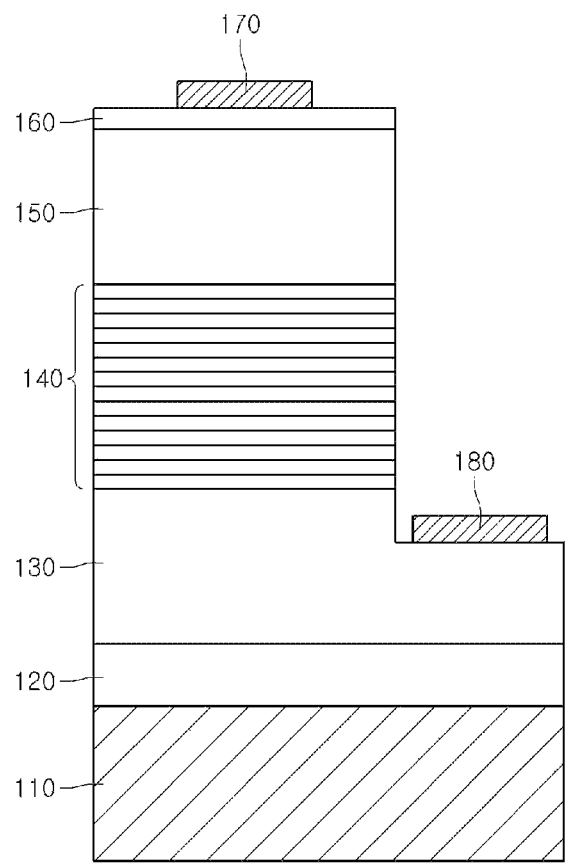
FIG. 11 is a view of a light emitting device having a lateral type electrode structure according to an embodiment.

FIG. 11 is a view of a light emitting device having a lateral type electrode structure according to an embodiment.

Referring to FIG. 11, a light emitting device 100 includes a substrate 110, an undoped semiconductor layer 120 on the substrate 110, a first conductive type semiconductor layer 130 on the undoped semiconductor layer 120, an active layer 140 including a plurality of quantum well layers and a plurality of barrier layers, which are alternately stacked on the first conductive type semiconductor layer 130, a second conductive type semiconductor layer 150 on the active layer 140, an electrode layer 160 on the second conductive type semiconductor layer 150, a first electrode 170 on the electrode layer 160, and a second electrode 180 on the first conductive type semiconductor layer 130.

In the light emitting device 100, a mesa etching process may be performed on the light emitting device 100A of FIG. 1, and the electrode layer 160 and the first electrode 170 may be disposed on the second conductive type semiconductor layer 150. Then, the second electrode 180 may be disposed on the first conductive type semiconductor layer 130 exposed by the mesa etching process.

For example, the mesa etching process may be performed by a dry etching process such as an inductively coupled plasma (ICP) process, but is not limited thereto.

The electrode layer 160 may be a transparent electrode layer formed of a light transmission material. For example, the electrode layer 160 may be formed of at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, and Ni/IrOx/Au/ITO.

Alternatively, the electrode layer 160 may be a reflective electrode. In this case, the electrode layer 160 may be formed of a metal or alloy including at least one of Ag, Al, Pt, and Pd.

The first and second electrodes 170 and 180 may be connected to an external power source using a wire. Also, the first and second electrodes 170 and 180 may be horizontally disposed to provide a power to the light emitting device having the lateral type electrode structure.

For example, the first and second electrodes 170 and 180 may have a single or multi-structure and may be formed of at least one of metal materials such as Cu, Ag, Al, Ni, Ti, Cr, Pd, Au, and Sn, but is not limited thereto.

Also, the second electrode 180 may be divided into an electrode pad section junctioned to the wire and an electrode blade section branched from the electrode pad section to spread current into the light emitting device having the lateral type electrode structure.

A portion of the second electrode 180 may contact the second conductive type semiconductor layer 150, but is not limited thereto.

<Light Emitting Device Having Vertical Type Electrode Structure>

Figure 12:
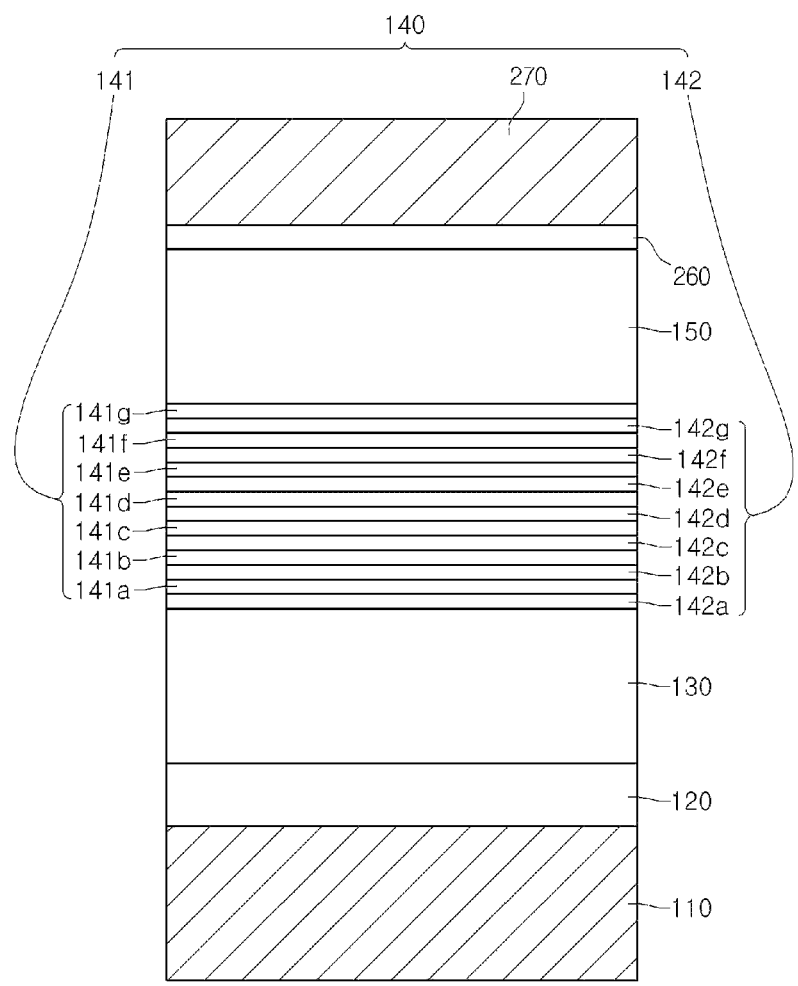
FIGS. 12 to 14 are views of a light emitting device having a vertical type electrode structure according to an embodiment.
Figure 13:
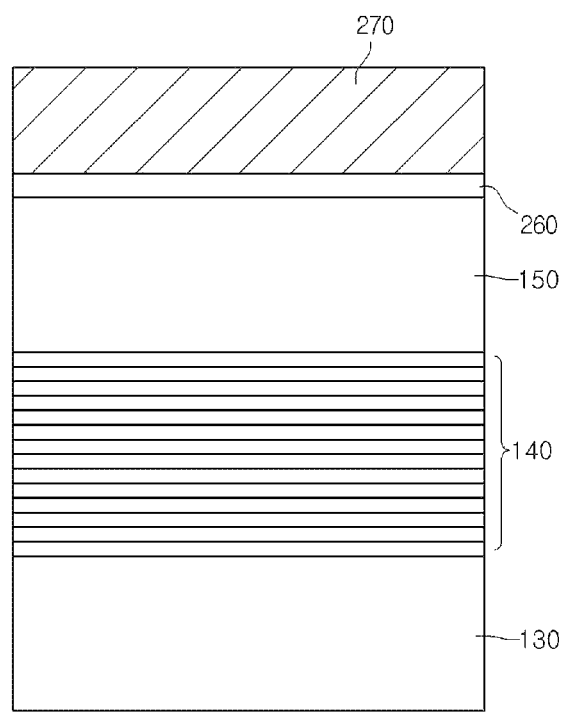
Figure 14:
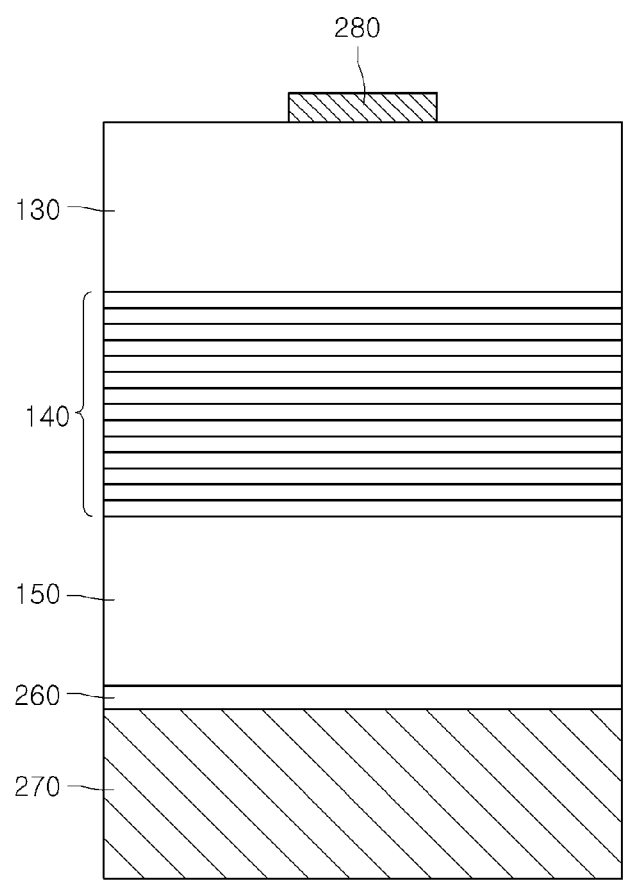

FIGS. 12 to 14 are views of a light emitting device having a vertical type electrode structure according to an embodiment.

Referring to FIG. 14, a light emitting device includes a first conductive type semiconductor layer 130, an active layer 140 including a plurality of quantum well layers and a plurality of barrier layers, which are alternately stacked on the first conductive type semiconductor layer 130, a second conductive type semiconductor layer 150 on the active layer 140, a reflective layer 260 on the second conductive type semiconductor layer 150, a conductive supporting member 270 on the reflective layer 260, and a third electrode 280 below the first conductive type semiconductor layer 130.

The light emitting device having the vertical type electrode structure has a structure in which the conductive supporting member 270 and the third electrode 280 are vertically disposed to receive a power.

The reflective layer 260 may reflect light incident from the active layer 140 to improve light emitting efficiency of the light emitting device. The reflective layer 260 may be formed of a metal or alloy including at least one of Ag, Al, Pt, and Pd.

Although not shown, a separate ohmic layer (not shown) for forming an ohmic-contact between the reflective layer 260 and the second conductive type semiconductor layer 150 may be further disposed between the reflective layer 260 and the second conductive type semiconductor layer 150. For example, the ohmic layer (not shown) may be formed of at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, and Ni/IrOx/Au/ITO. However, when the reflective layer 260 ohmic-contacts the second conductive type semiconductor layer 150, the ohmic layer (not shown) may not be provided.

The conductive supporting member 270 may support the light emitting device having the vertical type electrode structure, and simultaneously, at least portion of the conductive supporting member 270 vertically overlaps the third electrode 280 to provide a power to the light emitting device having the vertical type electrode structure.

The conductive supporting member 270 may be formed of at least one of Ti, Cr, Ni, Al, Pt, Au, W, Cu, Mo, and a substrate such as Si, Ge, GaAs, ZnO, SiC, SiGe, or GaN in which impurities are injected, but is not limited thereto.

An adhesion layer (not shown) for enhancing an interface adhesion force between the reflective layer 260 and the conductive supporting member 270 may be disposed between the reflective layer 260 and the conductive supporting member 270. The adhesion layer (not shown) may be formed of a metal having a superior adhesion force such as Ti or Au.

For example, the third electrode 280 may have a single or multi-structure and may be formed of at least one of metal materials such as Cu, Ag, Al, Ni, Ti, Cr, Pd, Au, and Sn, but is not limited thereto.

Hereinafter, a method of manufacturing the light emitting device having the vertical type electrode structure will be described with reference to FIGS. 1 and 12 to 14.

Referring to FIGS. 1 and 12, a reflective layer 260 and a conductive supporting member 270 may be formed on the light emitting device of FIG. 1.

For example, the reflective layer 260 may be formed by at least one deposition process of an E-beam deposition process, a sputtering process, and an plasma enhanced chemical vapor deposition (PECVD) process.

An adhesion layer (not shown) may be formed on the reflective layer 260, and then, the conductive supporting member 270 prepared as a separate sheet may be junctioned on the adhesion layer (not shown) using a bonding process to form the conductive supporting member 270.

Alternatively, a deposition or plating process may be performed on the reflective layer 260 to form the conductive supporting member 270. However, in this case, the adhesion layer (not shown) may not be formed.

Referring to FIGS. 12 and 13, the substrate 110 below the first conductive type semiconductor layer 130 may be removed.

For example, the substrate 110 may be removed by at least one of a laser lift off (LLO) process, a chemical lift off (CLO) process, and a physical polishing process, but is not limited thereto.

The substrate 110 may be removed, and then, the undoped semiconductor layer 120 may be removed. As shown in FIG. 14, a wet etching process may be performed to form a roughness on the first conductive type semiconductor layer 130. Here, the roughness may effectively extract light emitted from the active layer 140. Also, the roughness may have a random shape or a desired pattern shape that is formed by a patterning process to effectively extract light.

Referring to FIG. 14, the third electrode 280 is formed on the first conductive type semiconductor layer 130 to form the light emitting device having the vertical type electrode structure.

The third electrode 280 may be formed by the deposition process or plating process.

Figure 15:
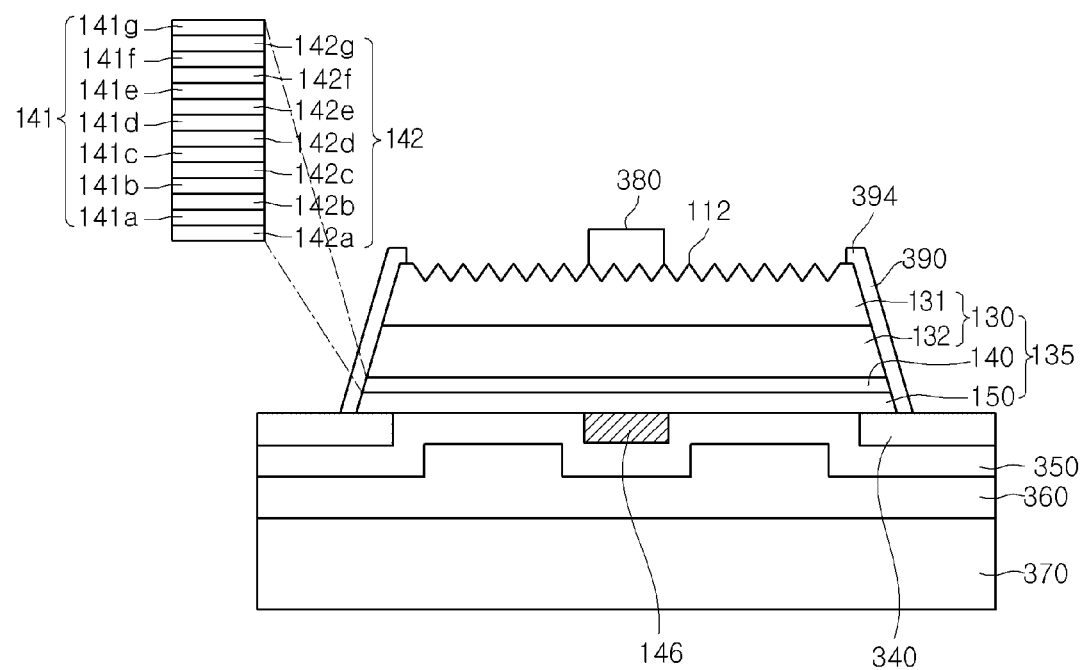
FIG. 15 is a sectional view of a light emitting device having a vertical type electrode structure according to an embodiment.

FIG. 15 is views of a light emitting device having a vertical type electrode structure according to another embodiment.

Referring to FIG. 15, the light emitting device includes a light emitting structure layer 135 having a plurality of compound semiconductor layers 130, 140, and 150, a current blocking layer 146, a channel layer 340, a first conductive layer 350, an second conductive layer 360, a support member 370, and an insulating layer 390.

The light emitting device may include a light emitting diode (LED) including compound semiconductors of group III-V elements. The groups III-V nitride semiconductors include a semiconductor material having a compound formula of $In_xAl_yGa_{1-x-y}N$ ($0 \leq x \leq 1$, $0 \leq y \leq 1$, and $0 \leq x+y \leq 1$). The LED may be an LED in a visible ray band of emitting blue, green, or red light, or an UV LED, but the LED may be variously realized with the technical scope of the embodiment.

The light emitting structure layer 135 includes the first conductive semiconductor layer 130, the active layer 140, and the second conductive semiconductor layer 150.

The first conductive semiconductor layer 130 may include one selected from the group consisting of GaN, AN, AlGaN, InGaN, InN, InAlGaN, AlInN, AlGaAs, GaP, GaAs, GaAsP, and AlGaInP, which are compound semiconductors of group III-V elements doped with first conductive type dopants. When the first conductive semiconductor layer 130 is an N-type semiconductor, the first conductive type dopant includes an N-type dopant such as Si, Ge, Sn, Se, or Te. The first conductive semiconductor layer 130 may have a single layer structure or a multiple layer structure, but the embodiment is not limited thereto. The first conductive semiconductor layer 130 may be provided on a top surface thereof with a light extraction structure such as a roughness pattern 112 for the purpose of light extraction efficiency. For the purpose of current diffusion and light extraction, the first conductive semiconductor layer 130 may be provided on the top surface thereof with a transparent electrode layer or an insulating layer.

An electrode 380 may be formed on the first conductive semiconductor layer 130. The electrode 380 may include a pad or may include an electrode pattern having a branch structure connected with the pad, but the embodiment is not limited thereto. The electrode 380 may be provided on a top surface thereof with a roughness and/or pattern, but the embodiment is not limited thereto. The top surface of the first conductive semiconductor layer 130, on which the electrode 380 is formed, may be flat, but the embodiment is not limited thereto.

The first conductive type semiconductor layer 130 includes a first semiconductor layer 131 and a second semiconductor layer 132 disposed under the first semiconductor layer 131. The first semiconductor layer 131 and the second semiconductor layer 132 may have different dopant concentrations, thicknesses, or composition formulas. The dopant concentration of the first semiconductor layer 131 may be lower than that of the second semiconductor layer 132. For example, the first semiconductor layer 131 may be a low conductive semiconductor layer, and the second semiconductor layer 132 may be more conductive than the first semiconductor layer 131. The first semiconductor layer 131 may be formed of an AlGaN layer, and the second semiconductor layer 132 may be formed of a GaN layer. A stacked structure of the first semiconductor layer 131 and the second semiconductor layer 132 may be repeated at least twice (two periods), but not limited thereto.

The stacked structure of the first semiconductor layer 131 and the second semiconductor layer 132 may be a super lattice structure (SLS) formed of a material selected from the group consisting of GaN, InN, AN, InGaN, AlGaN, InAlGaN, SiO2, SiOx, SiN2, SiNx, SiOxNy, and a metal material. In the super lattice structure, at least two different layers are alternately repeated at least two times (two periods). For example, a stacked structure of InGaN/GaN is repeated. Each layer of the super lattice structure may have a thickness of about several angstroms (A) or more.

Alternatively, the stacked structure of the first semiconductor layer 131 and the second semiconductor layer 132 may be formed by alternately stacking at least two layers having different refractive indexes so that the stacked layers may function as reflection layers. For example, a structure of GaN layer/AlN layer may be repeatedly stacked at least two periods to form a distributed Bragg reflector (DBR).

The electrode 380 may make ohmic contact with the top surface of the first conductive semiconductor layer 130. The electrode 380 may have a single layer structure or a multiple layer structure including at least one selected from the group consisting of Cr, Ti, Al, In, Ta, Pd, Co, Ni, Si, Ge, Ag, Cu, Au, and the mixture thereof. The electrode 380 may include the above material based on ohmic contact with the first conductive semiconductor layer 130, an adhesion property between metallic layers, a reflective property, and conductivity.

The active layer 140 is formed under the first conductive semiconductor layer 130. The active layer 140 may have a single quantum well structure, a multiple quantum well structure, a quantum wire structure, or a quantum dot structure. The active layer 140 including the plurality of quantum well layers 142 and the plurality of barrier layers 141 is alternately stacked. The active layer 140 are made from compound semiconductors of group III-V elements. For example, the active layer 140 may have a stack structure of an InGaN well layer/

GaN barrier layer, an InGaN well layer/AlGaN barrier layer, or an InGaN well layer/InGaN layer, but the embodiment is not limited thereto.

For example, the quantum well layers 142 have a compositional formula of InxAlyGa1-x-yN ($0 \leq x \leq 1$, $0 \leq y \leq 1$, $0 \leq x+y \leq 1$) and the barrier layers 141 have a compositional formula of InxAlyGa1-x-yN ($0 \leq x \leq 1$, $0 \leq y \leq 1$, $0 \leq x+y \leq 1$).

The plurality of barrier layers 141 may include first barrier layers 141a, 141b, 141c, and 141d in which a conductive type dopant is doped and at least one second barrier layer 141e, 141f, or 141g in which the conductive type dopant is not doped.

Although carriers (electrons and holes) are provided in the first and second conductive type semiconductor layers 130 and 150, the conductive type dopant may be doped into the first barrier layers 141a, 141b, 141c, and 141d to additionally secure the carriers, thereby improving internal quantum efficiency of the active layer 140.

The conductive type dopant may be an N-type or a P-type dopant. For example, the N-type dopant may include at least one of Si, Ge, Sn, and C, and the P-type dopant may include at least one of Mg, Zn, Ca, Sr, and Ba.

The at least one second barrier layer (141e, 141f, or 141g) may be disposed more close to the second conductive type semiconductor layer 150 than the first conductive type semiconductor layer 130. As a result, it may prevent light from being largely generated in quantum well layers 142f and 142g adjacent to the second conductive type semiconductor layer 150. Thus, it may be possible to improve reliability and light emitting quality of the light emitting device according to the embodiment.

When the P-type dopant having a relative large particle size is permeated into the quantum well layers 142f and 142g adjacent to the second conductive type semiconductor layer 150, the light emitting quality may be deteriorated. Also, when light is largely generated in a specific region of the active layer 140, the corresponding region may be deteriorated. The at least one second barrier layer 141e, 141f, or 141g may not be formed, but is not limited thereto.

The at least one second barrier layer 141e, 141f, or 141g may be disposed adjacent to any one of the first conductive type semiconductor layer 130 and the second conductive type semiconductor layer 150, and the plurality of first barrier layers 141a, 141b, 141c, and 141d may be disposed adjacent to the other one of the first conductive type semiconductor layer 130 and the second conductive type semiconductor layer 150.

Here, when the plurality of first barrier layers 141a, 141b, 141c, and 141d is disposed adjacent to the first conductive type semiconductor layer 130 including the N-type dopant, the conductive type dopant doped into the plurality of first barrier layers 141a, 141b, 141c, and 141d may be the N-type dopant. When the plurality of first barrier layers 141a, 141b, 141c, and 141d is disposed adjacent to the second conductive type semiconductor layer 150 including the P-type dopant, the conductive type dopant doped into the plurality of first barrier layers 141a, 141b, 141c, and 141d may be the P-type dopant.

For convenience of description, the at least one second barrier layer 141e, 141f, or 141d is a layer in which the dopant is not doped. Also, the second barrier layers 141e, 141f, or 141d include three layers and are disposed adjacent to the second conductive type semiconductor layer 150. The plurality of first barrier layers 141a, 141b, 141c, and 141d includes four layers and are disposed adjacent to the first conductive type semiconductor layer 130. Also, the N-type dopant is doped into the plurality of first barrier layers 141a, 141b, 141c, and 141d.

Also, the plurality of barrier layers 141 is called number 1 to 7 barrier layers in order from the barrier layer adjacent to the first conductive type semiconductor layer 130, and the plurality of quantum well layers 142 is called number 1 to 7 quantum well layers in order from the quantum well adjacent to the first conductive type semiconductor layer 130.

The plurality of first barrier layers 141a, 141b, 141c, and 141d may include the number 1 barrier layer 141a, the number 2 barrier layer 141b, the number 3 barrier layer 141c, and the number 4 barrier layer 141d, and the second barrier layers 141e, 141f, and 141g may include the number 5 barrier layer 141e, the number 6 barrier layer 141f, and the number 7 barrier layer 141g, but is not limited thereto. For example, the plurality of barrier layers 141 and the plurality of quantum well layers 142 may be repeatedly stacked two to thirty times.

A doping concentration of the N-type dopant may be higher at the first barrier layer 141a, 141b, 141c, or 141d adjacent to the second barrier layers 141e, 141f, and 141g.

That is, the doping concentration of the N-type dopant may be gradually increased in order from the first barrier layer 141a, 141b, 141c, or 141d away from the second barrier layers 141e, 141f, and 141g to the first barrier layer 141a, 141b, 141c, or 141d adjacent to the second barrier layers 141e, 141f, and 141g.

As the doping concentrations of the plurality of first barrier layers 141a, 141b, 141c, or 141d are successively increased, the light emitting efficiency and brightness of the plurality of quantum well layers 142 may be improved. Also, as a number and position of the actual light emitting layers of the plurality of quantum well layers 142 are controlled, the reliability of the active layer 140 may be improved.

In descriptions of another embodiment, the plurality of barrier layers 141 may include first barrier layers 141a, 141b, 141c, and 141d in which an N-type type dopant is doped and at least one second barrier layer 141e, 141f, or 141g in which the N-type dopant is not doped.

The at least one second barrier layer 141e, 141f, or 141g may be disposed adjacent to the second conductive type semiconductor layer 150, and the plurality of first barrier layers 141a, 141b, 141c, and 141d may be disposed adjacent to the first conductive type semiconductor layer 130.

A doping concentration of the N-type dopant may be relatively low in one layer of the plurality of first barrier layers 141a, 141b, 141c, and 141d adjacent to the at least one second barrier layer 141e, 141f, or 141g. That is, the plurality of first barrier layers 141a, 141b, 141c, and 141d may have doping concentrations gradually decreasing toward a layer adjacent to the second barrier layers 141e, 141f, and 141g.

For example, the number 1 barrier layer 141a may have a doping concentration of about $6.0 \times 10^{18}$ cm$^{-3}$, and the number 2 barrier layer 141b may have a doping concentration of about $3.0 \times 10^{18}$ cm$^{-3}$. Also, the number 3 barrier layer 141c may have a doping concentration of about $1.5 \times 10^{18}$ cm$^{-3}$, and the number 4 barrier layer 141d may have a doping concentration of about $7.5 \times 10^{17}$ cm$^{-3}$. The doping concentration of the N-type dopant may be successively decreased in about half for each layer. However, the doping concentration of the N-type dopant may be increased less than at least one time for each layer. For example, the doping concentration may be increased one time to about one-to-ten times or by a random ratio, but a regular ratio for each layer, but is not limited thereto.

A conductive clad layer may be formed on and/or under the active layer 140. The conductive clad layer may include a nitride-based semiconductor. The barrier layer may have a band gap higher than that of the well layer, and the conductive clad layer may have a band gap higher than that of the barrier layer.

The second conductive semiconductor layer 150 is formed under the active layer 140. The second conductive semiconductor layer 150 includes the compound semiconductors of group III-V elements doped with the second conductive type dopant. For instance, the second conductive semiconductor layer 150 may include at least one selected from the group consisting of GaN, AN, AlGaN, InGaN, InN, InAlGaN, AlInN, AlGaAs, GaP, GaAs, GaAsP, and AlGaInP. If the second conductive semiconductor layer 150 is a P type semiconductor layer, the second conductive semiconductor layer 150 may be prepared as a single layer or a multiple layer, but the embodiment is not limited thereto.

The light emitting structure layer 135 may further include a third conductive semiconductor layer under the second conductive semiconductor layer 140. The third conductive semiconductor layer may have polarities opposite to those of the second conductive semiconductor layer 140. The first conductive semiconductor layer 130 may include a P-type semiconductor layer, and the second conductive semiconductor layer 150 may include an N-type semiconductor. Accordingly, the light emitting structure layer 135 may include at least one of an N-P junction structure, a P-N junction structure, an N-P-N junction structure, and a P-N-P junction structure.

The channel layer 340 and the first conductive layer 350 are formed under the second conductive semiconductor layer 150 or the third conductive semiconductor layer. Hereinafter, for the purpose of explanation, the second conductive semiconductor layer 150 will serve as the lowest layer of the light emitting structure layer 135.

The channel layer 340 is provided at a channel region which is an outer portion of a chip, and the channel region becomes an outer peripheral portion of a chip corresponding to the boundary between chips. An outer portion of a top surface of the channel layer 340 is exposed to an outside, or may be covered by another material, for example, the insulating layer 390. In addition, the channel layer 340 may be provided on a top surface thereof with a roughness and/or a pattern, and the channel layer 340, and the roughness and/or the pattern of the channel layer 340 can improve light extraction efficiency in the channel region. The roughness or the pattern is formed at an outer portion of a top surface of the channel layer 340, and may include a material different from a material of the channel layer 340. The roughness or the pattern may include a material having a refractive index different from that of the channel layer 340. The roughness or the pattern may include compound semiconductors of group III-V elements. For example, the roughness or the pattern may include one selected from the group consisting of GaN, AN, AlGaN, InGaN, InN, InAlGaN, AlInN, AlGaAs, GaP, GaAs, GaAsP, and AlGaInP. The roughness or pattern may be formed by using the second conductive semiconductor that may be formed through an isolation etching process.

An inner portion of the top surface of the channel layer 340 makes contact with an outer portion of a lower surface of the second conductive semiconductor layer 150 with a predetermined width. The width is within a few micrometers (μm) or a few tens micrometers (μm). The width may vary depending on a chip size.

The channel layer 340 may be formed in a loop shape, a ring shape, or a frame shape at an outer peripheral portion of the lower surface of the second conductive semiconductor layer 150. The channel layer 340 may have a continuous pattern shape or a discontinuous pattern shape.

The channel layer 340 may include a material such as a transmissive oxide, a transmissive nitride, or a transmissive insulating material and has a refractive index lower than that of compound semiconductors of group III-V elements. The channel layer 340 may include one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SiO2, SiOx, SiOxNy, Si3N4, Al2O3, and TiO2.

If the channel layer 340 includes SiO2, the channel layer 340 may have the refractive index of about 2.3, and refractive indices of ITO and GaN are about 2.1 and about 2.4, respectively. Accordingly, light incident onto the channel layer 340 through the second conductive semiconductor layer 150 can be output to the outside. In this case, light extraction efficiency can be improved.

The channel layer 340 can prevent the light emitting structure layer 135 from being shorted even if the outer wall of the light emitting structure layer 135 is exposed to moisture, thereby enabling the LED to have superior property under the high moisture condition. If the channel layer 340 includes a transmissive material, when the laser scribing process is performed, the laser beam passes through the channel layer 340 so that metallic particles caused by the laser beam may not be generated from the channel region, thereby preventing interlayer short from occurring at the sidewall of the light emitting structure layer 135.

The channel layer 340 spaces the outer wall of each layer 130, 140, or 150 of the light emitting structure layer 135 apart from the first conductive layer 350. The channel layer 340 may have a thickness of about 0.02 μm to about 5 μm, and the thickness may vary according to a chip size.

An ohmic layer 145 is formed between the second conductive semiconductor layer 150 of the light emitting structure layer 135 and the first conductive layer 350. The ohmic layer may include one selected from the group consisting of ITO, IZO, IZTO, IAZO, IGZO, IGTO, AZO, ATO, and GZO which are conductive oxide-based materials, and may make ohmic contact through the above material. The ohmic layer may have at least one pattern and may include one selected from the group consisting of SiO2, SiOx, SiOxNy, Si3N4, Al2O3, and TiO2. The first conductive layer 350 may make contact with the second conductive semiconductor layer 150 in a region between the patterns of the ohmic layer.

A current blocking layer 146 is formed between the first conductive layer 350 and the second conductive semiconductor layer 150, and the current blocking layer 146 may have a non-metallic material having conductivity lower than that of the first conductive layer 350. The current blocking layer 146 may include at least one of ITO, IZO, IZTO, IAZO, IGZO, IGTO, AZO, ATO, ZnO, SiO2, SiOx, SiOxNy, Si3N4, Al2O3, and TiO2. In this case, when the first conductive layer 350 includes Ag, the current blocking layer 146 may include ITO, ZnO, or SiO2, but the embodiment is not limited thereto.

The current blocking layer 146 may include the same material as that of the channel layer 340, or include a material different from that of the channel layer 340.

The current blocking layer 146 may have a position and a pattern corresponding to the electrode 380, and the size of the current blocking layer 146 may vary according to current dispersion. The current blocking layer 146 may have a polygonal pattern or a circular pattern, and provided in a structure corresponding to the electrode 380 and/or a pad, so that current can be dispersed throughout the whole region of a chip. The current blocking layer 146 is formed under the light emitting structure 135 in such a manner that the current blocking layer 146 partially overlaps with the electrode 380. The current blocking layer 146 may include a material having electrical conductivity lower than that of the first conductive layer 350.

The first conductive layer 350 may be disposed at an inner area of the lower surface of the second conductive semiconductor layer 150. The first conductive layer 350 may include reflective metal or/and an ohmic property. The first conductive layer 350 may include seed metal, and the seed metal is used for a plating process. Accordingly, the first conductive layer 350 may include an ohmic layer, a seed layer, or a reflective layer, but the embodiment is not limited thereto.

The first conductive layer 350 may cover a portion of a lower surface of the channel layer 340. The portion of the lower surface of the channel layer 340 may correspond to about 80% or less of the width of the channel layer 340.

The first conductive layer 350 may include one selected from the group consisting of Ag, Ni, Al, Rh, Pd, Ir, Ru, Mg, Zn, Pt, Au, Hf, and the combination thereof in a single layer structure or a multiple layer structure. The first conductive layer 350 may selectively include the above materials and conductive oxide materials such as IZO, IZTO, IAZO, IGZO, IGTO, AZO, and ATO in a multiple structure. For example, the first conductive layer 350 may have a stack structure of IZO/Ni, AZO/Ag, IZO/Ag/Ni, or AZO/Ag/Ni.

The second conductive layer 360 may be formed under the first conductive layer 350 and be formed of a bonding layer. The second conductive layer 360 may make contact with a lower surface of the channel layer 340. The contact area may vary according to the first conductive layer 350, but the embodiment is not limited thereto. The second conductive layer 360 includes barrier metal or bonding metal. For example, the second conductive layer 360 may include at least one selected from the group consisting of Ti, Au, Sn, Ni, Cr, Ga, In, Bi, Cu, Ag and Ta.

The second conductive layer 360 may serve as a bonding layer, and is bonded with the support member 370 provided under the second conductive layer 360. The support member 370 can be plated on the first conductive layer 350 or attached to the first conductive layer 350 in the form of a sheet without using the second conductive layer 360.

The support member 370 is formed under the second conductive layer 360, and serves as a support conductive substrate. The support member 370 may include copper (Cu), gold (Au), nickel (Ni), molybdenum (Mo), copper-tungsten (Cu—W), or a carrier wafer such as Si, Ge, GaAs, ZnO, SiC, SiGe, or GaN. The support member 370 may not be formed, or may be prepared in the form of a conductive sheet.

An outer surface of the light emitting structure layer 135 may be inclined, and an insulating layer 390 may be formed on the outer surface of the light emitting structure layer 135. A lower end of the insulating layer 390 may make partially contact with a top surface of the channel layer 340, or may fully cover the top surface of the channel layer 340. An upper end 394 of the insulating layer 390 may be formed around the first conductive semiconductor layer 130. Accordingly, the insulating layer 390 makes contact with the channel layer 340, and is formed around the light emitting structure layer 135, so that interlayer short can be prevented from occurring at the outer surface of the light emitting structure layer 135. The insulating layer 390 may include a material, such as $SiO_2$, $SiO_x$, $SiO_xN_y$, $Si_3N_4$, $Al_2O_3$, or $TiO_2$, having a refractive index lower than a refractive index (GaN: about 2.4) of the compound semiconductor.

<Light Emitting Device Package>

Figure 16:
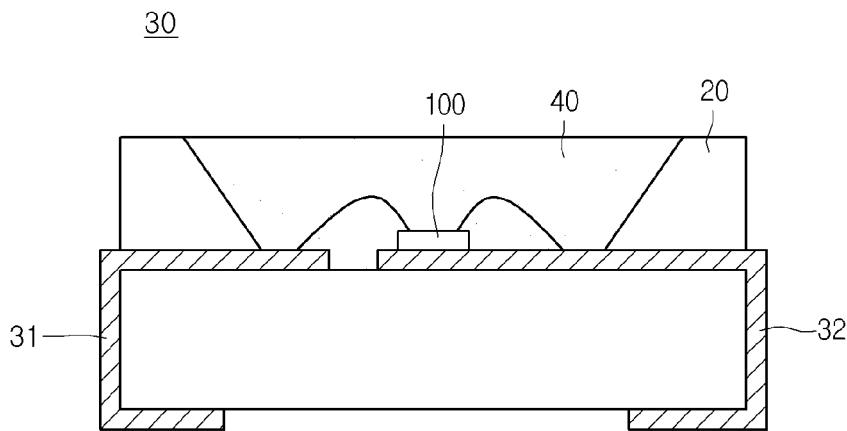
FIG. 16 is a sectional view of a light emitting device package including a light emitting device according to an embodiment.

FIG. 16 is a sectional view of a light emitting device package including a light emitting device according to an embodiment.

Referring to FIG. 16, the light emitting device package 30 according to the embodiment includes a body 20, first and second lead electrodes 31 and 32 on the body 20. A light emitting device 100 according to the embodiment disposed on the body 20 and electrically connected to the first and second lead electrodes 31 and 32, and a molding member 40 enclosing the light emitting device 100.

The body 20 may be formed of at least one of a silicon material, a synthetic resin material, or a metal material, and may have an inclination surface around the light emitting device 100.

The first and second lead electrodes 31 and 32 are electrically separated from each other and supply a power to the light emitting device 100. Also, the first and second lead electrodes 31 and 32 may reflect light generated from the light emitting device 100 to increase light efficiency and may emit heat generated from the light emitting device 100 to the outside.

Although one ends of the first and second lead electrodes 31 and 32 are disposed on the body 20 and the other ends are disposed on a bottom surface along an outer circumference of the body 20, the present disclosure is not limited thereto.

For example, the first and second lead electrodes 31 and 32 may be disposed on only the body 20, and first and second pads may be disposed on the bottom surface of the body 20. Also, the first and second lead electrodes 31 and 32 may be electrically connected to the first and second pads by first and second conducive vias.

The light emitting device 100 may be disposed on the body 20 or the first or second lead electrode 31 or 32.

Although the light emitting device 100 may be electrically connected to the first and second lead electrodes 31 and 32 by a wire bonding method, the present disclosure is not limited thereto. For example, the light emitting device 100 may be electrically connected to the first and second lead electrodes 31 and 32 by a flip chip method or a die bonding method. The light emitting device 100 may be a device having the lateral type electrode structure or the vertically type electrode structure, but is not limited thereto.

The molding member 40 may be formed of a silicon or resin material having light transmission and surround and protect the light emitting device 100. Also, a fluorescent material may be contained in the molding member 40 to change the wavelength of light emitted from the light emitting device 100.

Although the light emitting device package is a top view type in the embodiment, the present disclosure is not limited thereto. For example, the light emitting device package may be realized in a side view type to improve a heat dissipation characteristic, conductivity, and a reflective characteristic as described above. As described above, the top view or side view type light emitting device may be packaged with a resin layer, and then a lens may be disposed or adhered on/to the resin layer, but is not limited thereto.

<Lighting Unit>

The light emitting device or the light emitting device package according to the embodiment may be applied to a lighting unit. The lighting unit has a structure in which a plurality of light emitting devices or light emitting device packages is arrayed. Also, the lighting unit may include a display unit of FIGS. 17 and 18, a lighting unit of FIG. 19, a lamp, a traffic light, a vehicle headlight, and a sign.

Figure 17:
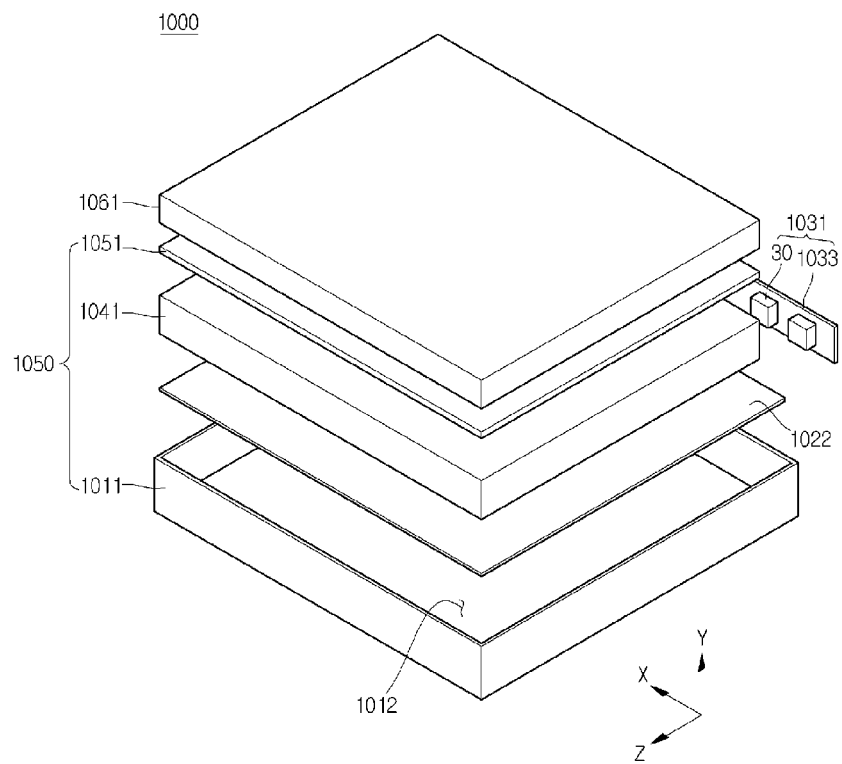
FIG. 17 is a view of a display unit using a light emitting device according to an embodiment.

FIG. 17 is an exploded perspective view of a display unit using a light emitting device according to an embodiment.

Referring to FIG. 17, a display unit 1000 according to an embodiment may include a light guide plate 1041, a light emitting module 1031 providing light to the light guide plate 1041, a reflective member 1022 below the light guide plate 1041, an optical sheet 1051 above the light guide plate 1041, a display panel 1061 above the optical sheet 1051, and a bottom cover 1011 receiving the light guide plate 1031, the light emitting module 1031, and the reflective member 1022, but is not limited thereto.

The bottom cover 1011, the reflective member 1022, the light guide plate 1041 may be defined as the lighting unit 1050.

The light guide plate 1041 diffuses light to produce planar light. The light guide plate 1041 may be formed of a transparent material. For example, the light guide plate 1041 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 provides light to at least one surface of the light guide plate 1041. Thus, the light emitting module 1031 may be used as a light source of a display device.

At least one light emitting module 1031 may be provided to directly or indirectly provide light on a lateral surface of the light guide plate 1041. The light emitting module 1031 may include a substrate 1033 and the light emitting device packages 30 according to the embodiment. The light emitting device packages 30 may be arrayed by a predetermined distance on the substrate 1033.

The substrate 1033 may be a PCB including a circuit pattern (not shown). However, the substrate 1033 may include a metal core PCB or a flexible PCB as well as the PCB, but is not limited thereto. When the light emitting device packages 30 are mounted on a lateral surface of the bottom cover 1011 or a heatsink plate, the substrate 1033 may be removed. Here, a portion of the heatsink plate may contact a top surface of the bottom cover 1011.

The plurality of light emitting device packages 30 may be mounted to allow a light emitting surface through which light is emitted onto the substrate 1033 to be spaced a predetermined distance from the light guide plate 1041, but is not limited thereto. The light emitting device packages 30 may directly or indirectly provide light to a light incident surface that is a side of the light guide plate 1041, but is not limited thereto.

The reflective member 1022 may be disposed below the light guide plate 1041. The reflective member 1022 reflects light incident onto a bottom surface of the light guide plate 1041 to proceed in an upward direction, thereby improving brightness of the backlight unit. For example, the reflective member 1022 may be formed of one of PET, PC, and PVC, but is not limited thereto. The reflective member 1022 may be a top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with an opened upper side, but is not limited thereto. The bottom cover 1011 may be coupled to a top cover, but is not limited thereto.

The bottom cover 1011 may be formed of a metal material or a resin material. Also, the bottom cover 1011 may be manufactured using a press forming process or an extrusion molding process. The bottom cover 1011 may be formed of a metal or non-metal having superior heat conductivity, but is not limited thereto.

For example, the display panel 1061 may be a liquid crystal display (LCD) panel, and include first and second substrates formed of a transparent material and a liquid crystal layer between the first and second substrates. A polarizing plate may be attached to at least one surface of the display panel 1061. The present disclosure is not limited to the attached structure of the polarizing plate. The display panel 1061 displays information by light passing through the optical sheet 1051. The display unit 1000 may be applied to various portable terminals, a monitor for a notebook computer, a monitor for a laptop computer, television, etc.

The optical sheet 1051 is disposed between the display panel 1061 and the light guide plate 1041 and includes at least one transmission sheet. For example, the optical sheet 1051 may include at least one of a diffusion sheet, a horizontal or vertical prism sheet, a bright enhancement sheet, etc. The diffusion sheet diffuses incident light, and the horizontal or/and vertical prism sheet collects the incident light into a display region. The bright enhancement sheet reuses lost light to improve brightness. Also, a protection sheet may be disposed on the display panel 1061, but is not limited thereto.

Here, an optical member such as the light guide plate 1041 and the optical sheet 1051 may be disposed on an optical path of the light emitting module 1031, but is not limited thereto.

Figure 18:
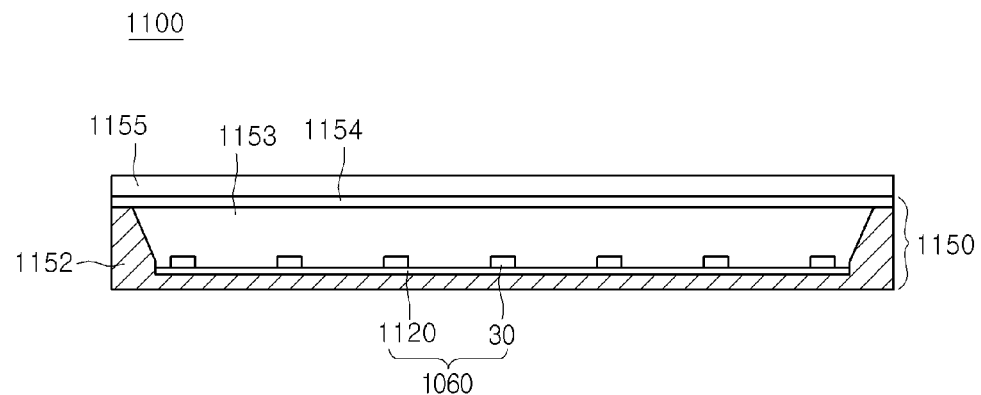
FIG. 18 is a view illustrating another example of a display unit using a light emitting device according to an embodiment.

FIG. 18 is a view of a display unit according to an embodiment.

Referring to FIG. 18, a display unit 1100 includes a bottom cover 1152, a substrate 1120 on which the light emitting device packages 30 described above are arrayed, an optical member 1154, and a display panel 1155.

The substrate 1120 and the light emitting device packages 30 may be defined as a light emitting module 1160. The bottom cover 1152, the at least one light emitting module 1060, and the optical member 1154 may be defined as a lighting unit.

The bottom cover 1152 may include a receiving part 1153, but is not limited thereto.

Here, the optical member 1154 may include at least one of a lens, a light guide plate, a diffusion sheet, horizontal and vertical prism sheets, and a bright enhancement sheet. The light guide plate may be formed of a PC material or PMMA material. In this case, the light guide plate may be removed. The diffusion sheet diffuses incident light, and the horizontal and vertical prism sheets collect the incident light into a display region. The bright enhancement sheet reuses lost light to improve brightness.

The optical member 1154 is disposed on the light emitting module 1060 to produce planar light using the light emitted from the light emitting module 1060 or diffuse and collect the light emitted from the light emitting module 1060.

Figure 19:
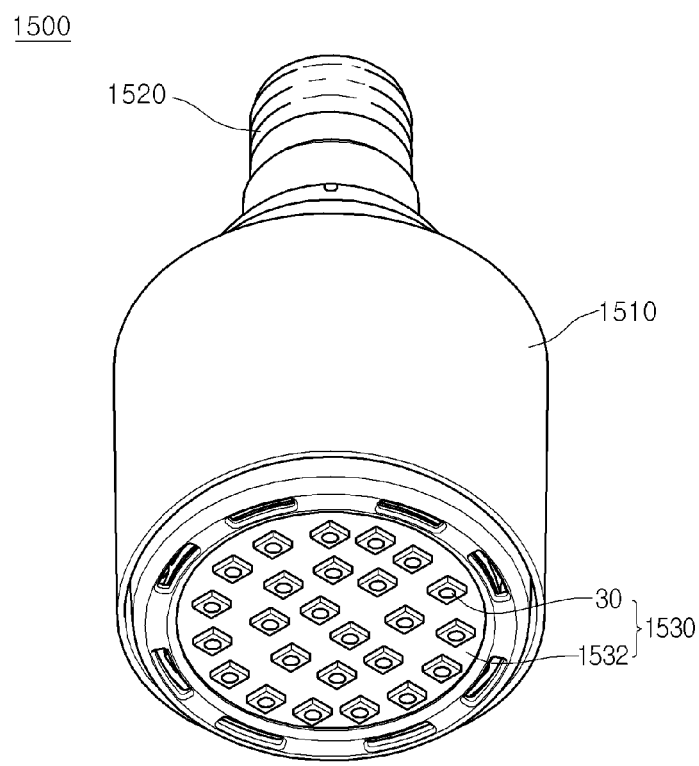
FIG. 19 is a view of a lighting unit using a light emitting device according to an embodiment.

FIG. 19 is a view of a lighting unit using a light emitting device according to an embodiment.

Referring to FIG. 19, the lighting unit 1500 may include a case 1510, a light emitting module 1530 in the case 1510, and a connection terminal 1520 disposed in the case 1510 to receive an electric power from an external power source.

The case 1510 may be preferably formed of a material having good heat shielding characteristics, for example, a metal material or a resin material.

The light emitting module 1530 may include a substrate 1532 and a light emitting device package 30 mounted on the substrate 1532. The light emitting device package 30 may be provided in plurality, and the plurality of light emitting device packages 30 may be arrayed in a matrix shape or spaced a predetermined distance from each other.

The substrate 1532 may be an insulator substrate on which a circuit pattern is printed. For example, the substrate may include a general printed circuit board (PCB), a metal core PCB, a flexible PCB, a ceramic PCB, etc.

Also, the substrate 1532 may be formed of a material to efficiently reflect light, and a surface thereof may be formed in a color capable of efficiently reflecting light, for example, white color, or silver color.

The at least one light emitting device packages 30 may be mounted on the substrate 1532. Each of the light emitting device packages 30 may include at least one light emitting diode (LED) chip. The LED chip may include a color LED emitting red, green, blue or white light, and a UV LED emitting ultraviolet (UV) rays.

The light emitting module 1530 may have a combination of several light emitting device packages to obtain desired color and luminance. For example, the light emitting module 1530 may have a combination of a white LED, a red LED, and a green LED to obtain a high color rendering index (CRI).

The connection terminal 1520 may be electrically connected to the light emitting module 1530 to supply a power. The connection terminal 1520 may be screwed and coupled to an external power source in a socket type, but is not limited thereto. For example, the connection terminal 1520 may be made in a pin type and inserted into an external power source, or may be connected to the external power source through a wire.

According to the embodiment, the light emitting device 100 may be packaged, and then mounted on the substrate to realize the light emitting module. Alternatively, the light emitting device 100 may be mounted in an LED chip shape, and then packaged to realize the light emitting module.

The light emitting module of the lighting unit includes the light emitting device package. The light emitting device package may have the package structure as shown in FIG. 15, or the light emitting device having the horizontal type electrode structure or the light emitting devices having the vertical type electrode structure may be mounted on the substrate, and then packaged using the molding member.

The characteristics, structures, and effects described above are included in at least one embodiment and are not limited to only one embodiment. Furthermore, it will be understood by those of ordinary skill in the art that various changes in form and details may be made therein without departing from the spirit and scope of the present invention as defined by the following claims.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductive type semiconductor layer;
an active layer including a plurality of quantum well layers and a plurality of barrier layers alternately arranged on the first conductive type semiconductor layer; and
a second conductive type semiconductor layer on the active layer,
wherein the plurality of barrier layers comprise a plurality of first barrier layers having different doping concentrations for each layer and a plurality of second barrier layers that are not doped,
wherein the plurality of second barrier layers are adjacent to the second conductive type semiconductor layer,
wherein the plurality of first barrier layers are adjacent to the first conductive type semiconductor layer,
wherein a doping concentration of each of the plurality of first barrier layers increases twice that of a previous first barrier layer as successive first barrier layers are closer to the plurality of second barrier layers,
wherein the active layer includes a first region emitting light having a first wavelength band and a second region emitting light having a second wavelength band having a main wavelength longer than a main wavelength of the first wavelength band,
wherein a quantum well layer between a first barrier layer most adjacent to the plurality of second barrier layers and a second barrier layer most adjacent to the plurality of first barrier layers has a light emitting intensity greater than a quantum well layer between a second barrier most adjacent to the second conductive type semiconductor layer and the second conductive semiconductor layer, and
wherein thicknesses of quantum well layers in the first region are thinner than those of quantum well layers and barrier layers in the second region.

2. The light emitting device according to claim 1, wherein a dopant in the plurality of first barrier layers includes an n-type dopant.

3. The light emitting device according to claim 2, wherein the plurality of first barrier layers and the plurality of second barrier layers are spaced from each other and each of the first barrier layers and the second barrier layers combines with one of the plurality of quantum well layers.

4. The light emitting device according to claim 1, wherein the first conductive type semiconductor layer is doped with n-type dopant, the second conductive type semiconductor layer is doped with p-type dopant, and the plurality of first barrier layers are doped with n-type dopant.

5. The light emitting device according to claim 2, wherein the plurality of quantum well layers and the plurality of quantum barrier layers are alternately arranged equal to or less than 30 times.

6. The light emitting device according to claim 4, wherein the plurality of first barrier layers are closer to the first conductive type semiconductor layer than to the second conductive type semiconductor layer, and
wherein the plurality of second barrier layers are closer to the second conductive type semiconductor layer than to the first conductive type semiconductor layer.

7. The light emitting device according to claim 1, wherein the plurality of quantum well layers and the plurality of barrier layers have a compositional formula of $In_xAl_yGa_{1-x-y}N$ ($0 \leq x \leq 1$, $0 \leq y \leq 1$, $0 \leq x+y \leq 1$) and the indium content in the plurality of quantum well layers is different from each other.

8. The light emitting device according to claim 7, wherein the active layer comprises a quantum well layer having indium (In) content of 10% to 30%.

9. The light emitting device according to claim 7, wherein the indium content in the active layer of the first region is less than that in the active layer of the second region.

10. The light emitting device according to claim 1, wherein the plurality of quantum well layers and the plurality of barrier layers have thicknesses different from each other.

11. The light emitting device according to claim 1, wherein one of the first wavelength band and the second wavelength band emits light of 430nm to 470nm.

12. A light emitting device comprising:
a first conductive type semiconductor layer;
an active layer including a plurality of quantum well layers and a plurality of barrier layers alternately arranged on the first conductive type semiconductor layer; and
a second conductive type semiconductor layer on the active layer,
wherein the plurality of barrier layers comprise a plurality of first barrier layers having different doping concentrations for each layer and a plurality of second barrier layers that are not doped,
wherein the plurality of second barrier layer are adjacent to the second conductive type semiconductor layer,
wherein the plurality of first barrier layers are adjacent to the first conductive type semiconductor layer,
wherein an n-type doping concentration of each of the plurality of first barrier layers increases twice that of a previous first barrier layer as each successive first barrier layer is closer to the plurality of second barrier layers,
wherein the first conductive type semiconductor layer is doped with n-type dopant and the second conductive type semiconductor layer is doped with p-type dopant,
wherein the plurality of first barrier layers comprise first through fourth barrier layers,
wherein the plurality of second barrier layers comprise fifth through seventh barrier layers, and
wherein a quantum well layer between the fourth barrier layer and the fifth barrier layer has a light emitting intensity greater than a quantum well layer between the seventh barrier layer and the second conductive type semiconductor layer.

13. The light emitting device according to claim 12, wherein the plurality of first barrier layers are closer to the first conductive type semiconductor layer than to the second conductive type semiconductor layer, and the plurality of second barrier layers are closer to the second conductive type semiconductor layer than to the first conductive type semiconductor layer.

14. The light emitting device according to claim 12, wherein the plurality of first barrier layers are closer to the second conductive type semiconductor layer than to the first conductive type semiconductor layer, and the plurality of second barrier layers are closer to the first conductive type semiconductor layer than to the second conductive type semiconductor layer.

15. A light emitting device comprising:
a first conductive type semiconductor layer having an n-type dopant;
an active layer including a plurality of quantum well layers and a plurality of barrier layers alternately arranged on the first conductive type semiconductor layer; and
a second conductive type semiconductor layer having a p-type dopant on the active layer,
wherein the plurality of barrier layers comprise a plurality of first barrier layers having a p-type dopant with different doping concentrations for each layer and a plurality of second barrier layers that is not doped,
wherein the plurality of second barrier layers are adjacent to the first conductive type semiconductor layer,
wherein the plurality of first barrier layers are adjacent to the second conductive type semiconductor layer,
wherein a doping concentration of each of the plurality of first barrier layers increases twice that of a previous first barrier layer as each successive first barrier layer is closer to the plurality of second barrier layers, and
wherein a quantum well layer between a first barrier layer most adjacent to the plurality of second barrier layers and a second barrier layer most adjacent to the plurality of first barrier layers has a light emitting intensity greater than a quantum well layer between the second barrier most adjacent to the first conductive type semiconductor layer and the first conductive type semiconductor layer.

* * * * *